United States Patent
Karandikar et al.

(10) Patent No.: US 11,146,276 B2
(45) Date of Patent: Oct. 12, 2021

(54) NOISE REDUCTION AND SPUR AND DISTORTION CANCELLATION TECHNIQUES

(71) Applicant: Intel Corporation, Santa Clara, CA (US)

(72) Inventors: Niranjan Karandikar, Chandler, AZ (US); Mohammed Alam, Chandler, AZ (US); Gregory Chance, Chandler, AZ (US); Armando Cova, Chandler, AZ (US); Michael Milyard, Chandler, AZ (US); John J. Parkes, Jr., Chandler, AZ (US); Ashoke Ravi, Portland, OR (US); Daniel Schwartz, Scottsdale, AZ (US); Dong-Jun Yang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/958,034

(22) PCT Filed: Mar. 30, 2018

(86) PCT No.: PCT/US2018/025433
§ 371 (c)(1),
(2) Date: Jun. 25, 2020

(87) PCT Pub. No.: WO2019/190554
PCT Pub. Date: Oct. 3, 2019

(65) Prior Publication Data
US 2021/0067163 A1   Mar. 4, 2021

(51) Int. Cl.
*H04B 1/10*   (2006.01)
*H03L 7/085*   (2006.01)
(Continued)

(52) U.S. Cl.
CPC ............ *H03L 7/085* (2013.01); *H04B 1/126* (2013.01); *H04B 1/18* (2013.01);
(Continued)

(58) Field of Classification Search
CPC ............ H03L 7/085; H04L 25/03261; H04L 25/03949; H04L 25/085; H04B 1/126; H04B 1/18
(Continued)

(56) References Cited

U.S. PATENT DOCUMENTS

2007/0202830 A1* 8/2007 Muhammad ........... H04B 1/123
455/298
2008/0101212 A1* 5/2008 Yu ....................... H04L 27/2655
370/208

(Continued)

FOREIGN PATENT DOCUMENTS

WO   WO-2019190554 A1   10/2019

OTHER PUBLICATIONS

"International Application Serial No. PCT/US2018/025433, International Search Report dated Dec. 13, 2018", 3 pgs.
(Continued)

*Primary Examiner* — Don N Vo
(74) *Attorney, Agent, or Firm* — Schwegman Lundberg & Woessner, P.A.

(57) ABSTRACT

A wireless communication device can include an antenna configured to sense a radio frequency (RF) signal. The wireless communication device can include signal estimation circuitry configured to generate estimates of amplitude and frequency for unmodulated spurs within the RF signal. The wireless communication device can further include multi-tone generator circuitry coupled to the signal estimation circuitry and configured to generate a composite spur cancellation signal based on the estimates of amplitude and
(Continued)

frequency for unmodulated spurs within the RF signal. The wireless communication device can further include adder circuitry configured to subtract the spur cancellation signal from the RF signal to generate a spur cancelled signal.

11 Claims, 14 Drawing Sheets

(51) Int. Cl.
    *H04B 1/12*     (2006.01)
    *H04B 1/18*     (2006.01)
    *H04L 25/03*     (2006.01)
    *H04L 25/08*     (2006.01)

(52) U.S. Cl.
    CPC .. *H04L 25/03261* (2013.01); *H04L 25/03949* (2013.01); *H04L 25/085* (2013.01)

(58) Field of Classification Search
    USPC .................................................. 375/346–351
    See application file for complete search history.

(56) References Cited

U.S. PATENT DOCUMENTS

| | | |
|---|---|---|
| 2009/0325494 A1 | 12/2009 | Staszewski et al. |
| 2010/0214145 A1 | 8/2010 | Narasimhan et al. |
| 2011/0007839 A1* | 1/2011 | Tang ........................ H03F 3/195 |
| | | 375/296 |
| 2014/0140440 A1 | 5/2014 | Sun et al. |
| 2015/0124914 A1 | 5/2015 | Arslan |
| 2015/0126128 A1* | 5/2015 | Youngblood .......... H04B 15/00 |
| | | 455/63.1 |
| 2016/0134315 A1* | 5/2016 | Brunn .................. H04B 1/1036 |
| | | 375/343 |
| 2016/0359493 A1* | 12/2016 | Chen ....................... H03L 7/093 |
| 2017/0288851 A1 | 10/2017 | Avivi et al. |

OTHER PUBLICATIONS

"International Application Serial No. PCT/US2018/025433, Written Opinion dated Dec. 13, 2018", 9 pgs.

* cited by examiner

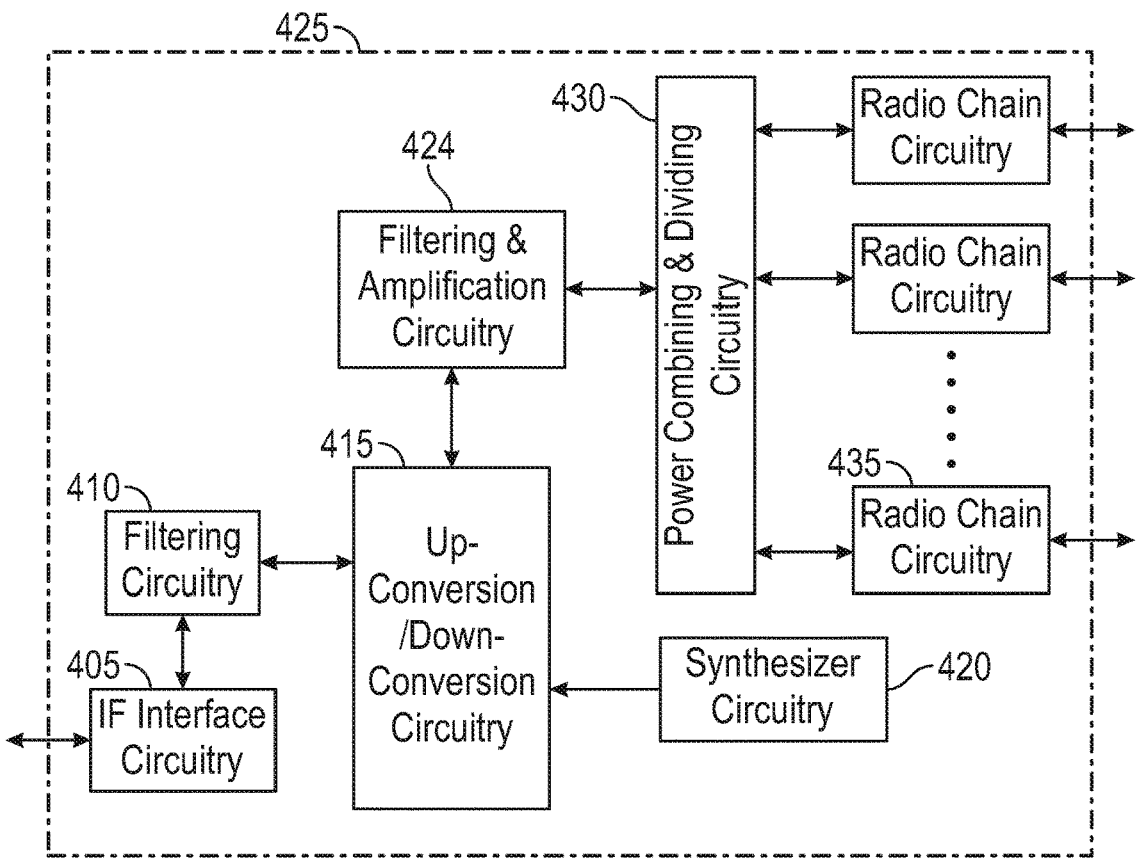
FIG. 4
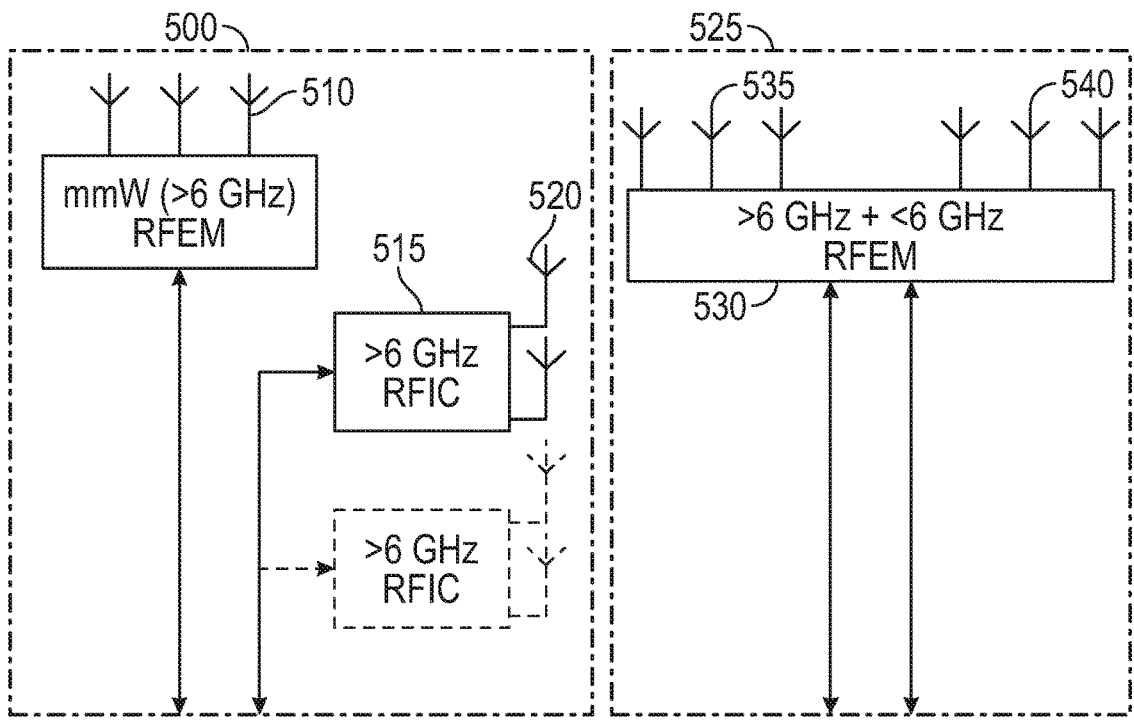
FIG. 5A
FIG. 5B

NOISE REDUCTION AND SPUR AND DISTORTION CANCELLATION TECHNIQUES

CROSS-REFERENCE TO RELATED APPLICATION

This application is a U.S. National Stage Filing under 35 U.S.C. 371 from International Application No. PCT/US2018/025433, filed on 30 Mar. 2018, and published as WO 2019/190554 A1 on 3 Oct. 2019, which application is incorporated herein by reference in its entirety.

TECHNICAL FIELD

Aspects of the disclosure pertain to radio frequency (RF) communications. More particularly, aspects relate to mitigation of interference sources and reduction in noise in RF communications. Some aspects of the disclosure pertain to reduction of spurious artifacts, and some aspects pertain to distortion cancellation.

BACKGROUND

A multimode transceiver can support multiple radio technologies that can coexist and operate independently. However, interference aggressors may be more prevalent and have different characteristics in multimode transceivers. For example, interference may be generated due to the presence of spur frequency components in outputs of local oscillators (LOs) that perform up and down translations between baseband and radio frequency (RF) signals. This interference may need to be cancelled to maintain performance of the multimode transceiver in all operation modes. Other interference can be caused when the multimode transceiver is transmitting and receiving at the same time, causing degradation of the received signal.

Additionally, in modern wireless communication systems, there is a constant push to increase data throughput. Throughput can be increased by increasing RF signal bandwidth and modulation order. However, enhanced signal-to-noise ratio (SNR) and error vector magnitude (EVM) targets need to be met to maintain quality of reception at these higher bandwidths and modulation orders. RF phase locked loops (PLLs) need to meet stringent phase noise requirements to meet enhanced SNR and EVM targets.

BRIEF DESCRIPTION OF THE DRAWINGS

In the drawings, which are not necessarily drawn to scale, like numerals may describe similar components in different views. Like numerals having different letter suffixes may represent different instances of similar components. Some aspects are illustrated by way of example, and not limitation, in the figures of the accompanying drawings in which:

FIG. 4 illustrates exemplary useable RF circuitry in FIG. 3A according to some aspects.

FIG. 5A illustrates an aspect of an exemplary radio front end module (RFEM) according to some aspects.

FIG. 5B illustrates an alternate aspect of an exemplary radio front end module, according to some aspects.

DETAILED DESCRIPTION

Figure 1:
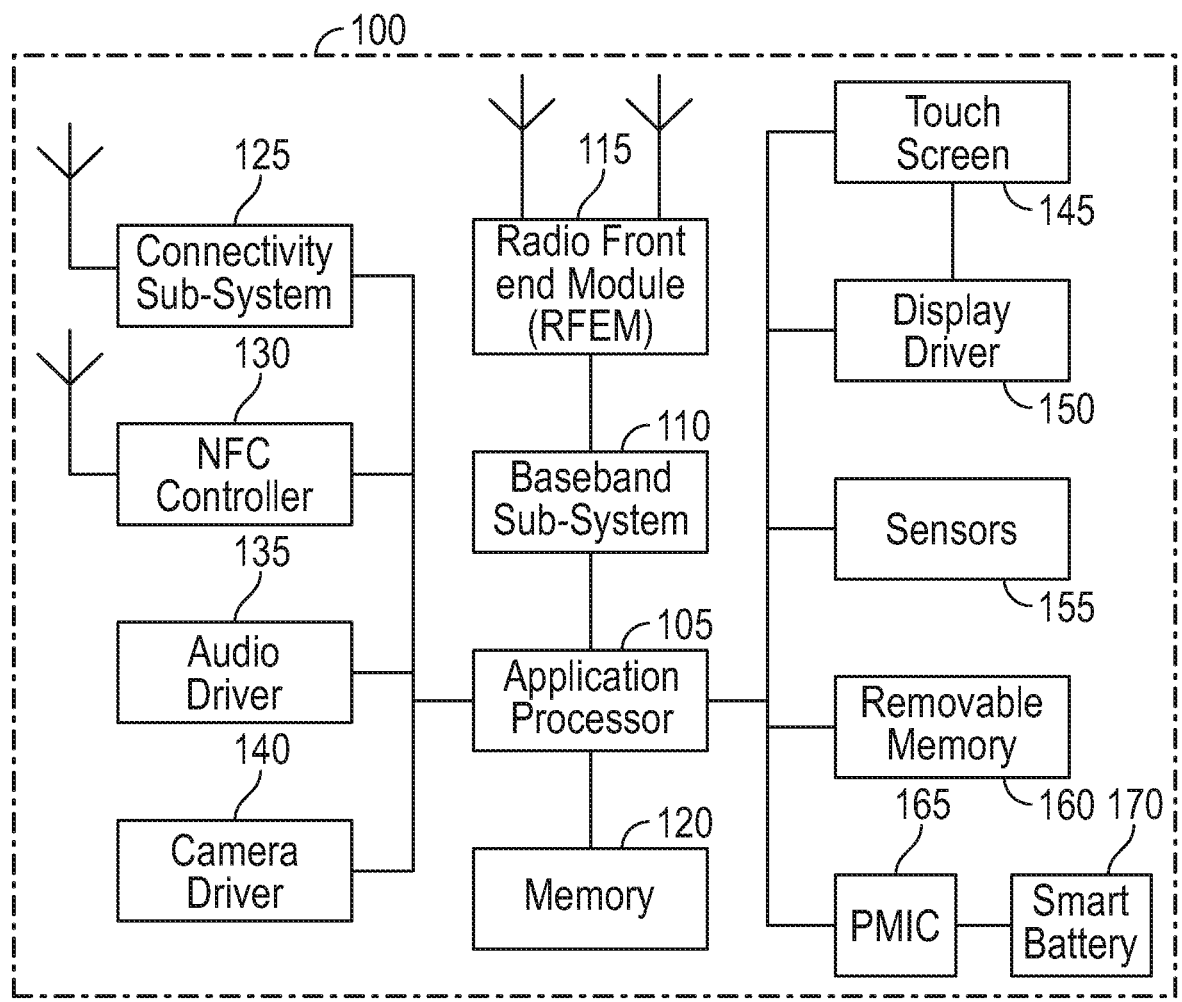
FIG. 1 illustrates an exemplary user device according to some aspects.

The following description and the drawings sufficiently illustrate specific aspects to enable those skilled in the art to practice them. Other aspects may incorporate structural, logical, electrical, process, and other changes. Portions and features of some aspects may be included in, or substituted for, those of other aspects. Aspects set forth in the claims encompass all available equivalents of those claims.

With the advancement of wireless communications, such as 3G, 4G and 5G communications, several challenges have evolved in the wireless transceiver design, such as increased presence of interference aggressors, and of a need to reduce noise sources and signal distortion. Techniques disclosed herein can be used to address these challenges. More specifically, techniques disclosed herein can include providing architectures for cancellation of noise artifacts such as continuous wave (CW) spurs, reducing phase noise, reducing distortion, and so forth.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality", as used herein, include, for example, "multiple" or "two or more". For example, "a plurality of items" includes two or more items.

References to "one aspect", "an aspect", "an example aspect", "some aspects", "demonstrative aspect", "various aspects" etc., indicate that the aspect(s) so described may include a particular feature, structure, or characteristic, but not every aspect necessarily includes the particular feature, structure, or characteristic. Further, repeated use of the phrase "in one aspect" does not necessarily refer to the same aspect, although it may.

As used herein, unless otherwise specified the use of the ordinal adjectives "first", "second", "third" etc., to describe a common object, merely indicate that different instances of like objects are being referred to, and are not intended to imply that the objects so described must be in a given sequence, either temporally, spatially, in ranking, or in any other manner.

Some aspects may be used in conjunction with various devices and systems, for example, a User Equipment (UE), a Mobile Device (MD), a wireless station (STA), a Personal Computer (PC), a desktop computer, a mobile computer, a laptop computer, a notebook computer, a tablet computer, a server computer, a handheld computer, a sensor device, an Internet of Things (IoT) device, a wearable device, a handheld device, a Personal Digital Assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless Access Point (AP), a wired or wireless router, a wired or wireless modem, a video device, an audio device, an audio-video (A/V) device, a wired or wireless network, a wireless area network, a Wireless Video Area Network (WVAN), a Local Area Network (LAN), a Wireless LAN (WLAN), a Personal Area Network (PAN), a Wireless PAN (WPAN), and the like.

Some aspects may, for example, be used in conjunction with devices and/or networks operating in accordance with existing IEEE 802.11 standards (including IEEE 802.11-2016 (IEEE 802.11-2016, IEEE Standard for Information technology—Telecommunications and information exchange between systems Local and metropolitan area networks-Specific requirements Part 11: Wireless LAN Medium Access Control (MAC) and Physical Layer (PHY) Specifications, Dec. 7, 2016); IEEE 802.11ay (P802.11ay Standard for Information Technology—Telecommunications and Information Exchange Between Systems Local and Metropolitan Area Networks-Specific Requirements Part 11: Wireless LAN Medium Access Control (MAC) and Physical Layer (PHY) Specifications—Amendment: Enhanced Throughput for Operation in License-Exempt Bands Above 45 GHz)) and/or future versions and/or derivatives thereof, devices and/or networks operating in accordance with existing WiFi Alliance (WFA) Peer-to-Peer (P2P) specifications (including WiFi P2P technical specification, version 1.5, Aug. 4, 2015) and/or future versions and/or derivatives thereof, devices and/or networks operating in accordance with existing Wireless-Gigabit-Alliance (WGA) specifications (including Wireless Gigabit Alliance, Inc WiGig MAC and PHY Specification Version 1.1, April 2011, Final specification) and/or future versions and/or derivatives thereof, devices and/or networks operating in accordance with existing cellular specifications and/or protocols, e.g., 3rd Generation Partnership Project (3GPP), 3GPP Long Term Evolution (LTE) and/or future versions and/or derivatives thereof, units and/or devices which are part of the above networks, and the like.

Some aspects may be used in conjunction with one way and/or two-way radio communication systems, cellular radio-telephone communication systems, a mobile phone, a cellular telephone, a wireless telephone, a Personal Communication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a Single Input Multiple Output (SIMO) transceiver or device, a Multiple Input Single Output (MISO) transceiver or device, a device having one or more internal antennas and/or external antennas, Digital Video Broadcast (DVB) devices or systems, multi-standard radio devices or systems, a wired or wireless handheld device, e.g., a Smartphone, a Wireless Application Protocol (WAP) device, or the like.

Some aspects may be used in conjunction with one or more types of wireless communication signals and/or systems, for example, Radio Frequency (RF), Infra-Red (IR), Frequency-Division Multiplexing (FDM), Orthogonal FDM (OFDM), Orthogonal Frequency-Division Multiple Access (OFDMA), Spatial Divisional Multiple Access (SDMA), FDM Time-Division Multiplexing (TDM), Time-Division Multiple Access (TDMA), Multi-User MIMO (MU-MIMO), Extended TDMA (E-TDMA), General Packet Radio Service (GPRS), extended GPRS, Code-Division Multiple Access (CDMA), Wideband CDMA (WCDMA), CDMA 2000, single-carrier CDMA, multi-carrier CDMA, Multi-Carrier Modulation (MDM), Discrete Multi-Tone (DMT), Bluetooth, Global Positioning System (GPS), Wi-Fi, Wi-Max, ZigBee™, Ultra-Wideband (UWB), Global System for Mobile communication (GSM), 2G, 2.5G, 3G, 3.5G, 4G, Fifth Generation (5G) mobile networks, 3GPP, Long Term Evolution (LTE), LTE advanced, Enhanced Data rates for GSM Evolution (EDGE), or the like. Other aspects may be used in various other devices, systems and/or networks.

The term "wireless device", as used herein, includes, for example, a device capable of wireless communication, a communication device capable of wireless communication, a communication station capable of wireless communication, a portable or non-portable device capable of wireless communication, or the like. In some demonstrative aspects, a wireless device may be or may include a peripheral that is integrated with a computer, or a peripheral that is attached to a computer. In some demonstrative aspects, the term "wireless device" may optionally include a wireless service.

The term "communicating" as used herein with respect to a communication signal includes transmitting the communication signal and/or receiving the communication signal. For example, a communication unit, which is capable of communicating a communication signal, may include a transmitter to transmit the communication signal to at least one other communication unit, and/or a communication receiver to receive the communication signal from at least one other communication unit. The verb communicating may be used to refer to the action of transmitting and/or the action of receiving. In one example, the phrase "communicating a signal" may refer to the action of transmitting the signal by a first device, and may not necessarily include the action of receiving the signal by a second device. In another example, the phrase "communicating a signal" may refer to the action of receiving the signal by a first device, and may not necessarily include the action of transmitting the signal by a second device.

Some demonstrative aspects may be used in conjunction with a wireless communication network communicating over a frequency band above 45 Gigahertz (GHz), e.g., 60 GHz. However, other aspects may be implemented utilizing any other suitable wireless communication frequency bands, for example, an Extremely High Frequency (EHF) band (the millimeter wave (mmWave) frequency band), e.g., a frequency band within the frequency band of between 20 GHz and 300 GHz, a frequency band above 45 GHz, a frequency band below 20 GHz, e.g., a Sub 1 GHz (SIG) band, a 2.4 GHz band, a 5 GHz band, a WLAN frequency band, a WPAN frequency band, a frequency band according to the WGA specification, and the like.

As used herein, the term "circuitry" may, for example, refer to, be part of, or include, an Application Specific Integrated Circuit (ASIC), an integrated circuit, an electronic circuit, a processor (shared, dedicated, or group), and/or memory (shared, dedicated, or group), that execute one or more software or firmware programs, a combinational logic circuit, and/or other suitable hardware components that provide the described functionality. In some aspects, circuitry may include logic, at least partially operable in hardware. In some aspects, the circuitry may be implemented as part of and/or in the form of a radio virtual machine (RVM), for example, as part of a Radio processor (RP) configured to execute code to configured one or more operations and/or functionalities of one or more radio components.

The term "logic" may refer, for example, to computing logic embedded in circuitry of a computing apparatus and/or computing logic stored in a memory of a computing apparatus. For example, the logic may be accessible by a processor of the computing apparatus to execute the computing logic to perform computing functions and/or operations. In one example, logic may be embedded in various types of memory and/or firmware, e.g., silicon blocks of various chips and/or processors. Logic may be included in, and/or implemented as part of, various circuitry, e.g., radio circuitry, receiver circuitry, control circuitry, transmitter circuitry, transceiver circuitry, processor circuitry, and/or the like. In one example, logic may be embedded in volatile memory and/or non-volatile memory, including random access memory, read only memory, programmable memory, magnetic memory, flash memory, persistent memory, and/or the like. Logic may be executed by one or more processors using memory, e.g., registers, buffers, stacks, and the like, coupled to the one or more processors, e.g., as necessary to execute the logic.

The term "antenna" or "antenna array", as used herein, may include any suitable configuration, structure and/or arrangement of one or more antenna elements, components, units, assemblies and/or arrays. In some aspects, the antenna may implement transmit and receive functionalities using separate transmit and receive antenna elements. In some aspects, the antenna may implement transmit and receive functionalities using common and/or integrated transmit/receive elements. The antenna may include, for example, a phased array antenna, a single element antenna, a set of switched beam antennas, and/or the like.

FIG. 1 illustrates an exemplary user device according to some aspects. The user device 100 may be a mobile device in some aspects and includes an application processor 105, baseband processor 110 (also referred to as a baseband sub-system), radio front end module (RFEM) 115, memory 120, connectivity sub-system 125, near field communication (NFC) controller 130, audio driver 135, camera driver 140, touch screen 145, display driver 150, sensors 155, removable memory 160, power management integrated circuit (PMIC) 165, and smart battery 170.

In some aspects, application processor 105 may include, for example, one or more central processing unit (CPU) cores and one or more of cache memory, low drop-out voltage regulators (LDOs), interrupt controllers, serial interfaces such as SPI, I2C or universal programmable serial interface sub-system, real time clock (RTC), timer-counters including interval and watchdog timers, general purpose IO, memory card controllers such as SD/MMC or similar, USB interfaces, MIPI interfaces, and/or Joint Test Access Group (JTAG) test access ports.

In some aspects, baseband processor 110 may be implemented, for example, as a solder-down substrate including one or more integrated circuits, a single packaged integrated circuit soldered to a main circuit board, and/or a multi-chip module including two or more integrated circuits.

Applications of mmWave technology can include, for example, WiGig and future 5G, but the mmWave technology can be applicable to a variety of telecommunications systems. The mmWave technology can be especially attractive for short-range telecommunications systems. WiGig devices operate in the unlicensed 60 GHz band, whereas 5G mmWave is expected to operate initially in the licensed 28 GHz and 39 GHz bands. A block diagram of an example baseband sub-system 110 and RFEM 115 in a mmWave system is shown in FIG. 1A.

Figure 1A:
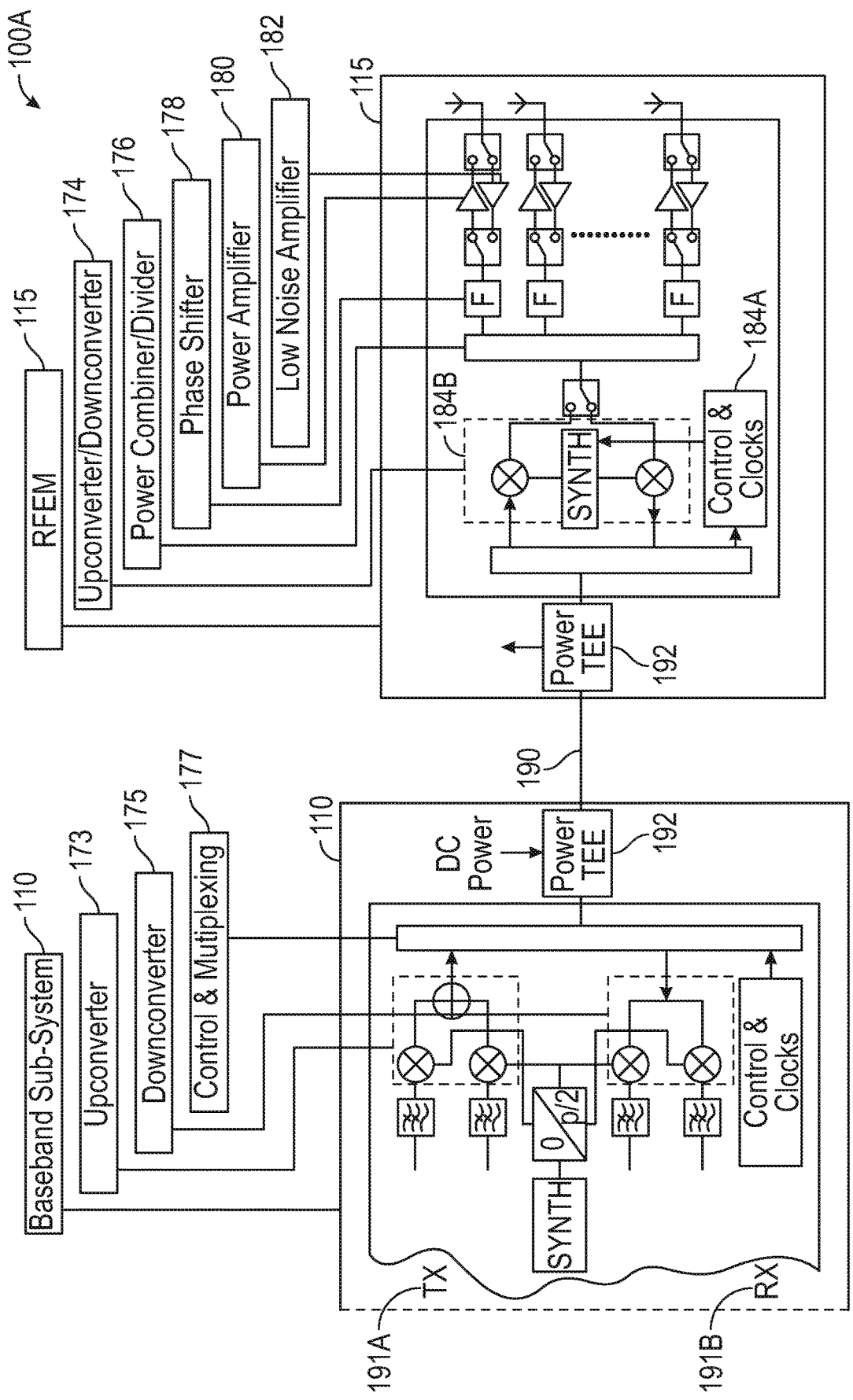
FIG. 1A illustrates a mmWave system, which can be used in connection with the device of FIG. 1 according to some aspects.

FIG. 1A illustrates a mmWave system 100A, which can be used in connection with the device 100 of FIG. 1 according to some aspects of the present disclosure. The system 100A includes two components: a baseband sub-system 110 and one or more radio front end modules (RFEMs) 115. The RFEM 115 can be connected to the baseband sub-system 110 by a single coaxial cable 190, which supplies a modulated intermediate frequency (IF) signal, DC power, clocking signals and control signals.

The baseband sub-system 110 is not shown in its entirety, but FIG. 1A rather shows an implementation of analog front end. This includes a transmitter (TX) section 191A with an upconverter 173 to intermediate frequency (IF) (around 10 GHz in current implementations), a receiver (RX) section 191B with downconversion 175 from IF to baseband, control and multiplexing circuitry 177 including a combiner to multiplex/demultiplex transmit and receive signals onto a single cable 190. In addition, power tee circuitry 192 (which includes discrete components) is included on the baseband circuit board to provide DC power for the RFEM 115. In some aspects, the combination of the TX section and RX section may be referred to as a transceiver, to which may be coupled one or more antennas or antenna arrays of the types described herein.

The RFEM 115 can be a small circuit board including a number of printed antennas and one or more RF devices containing multiple radio chains, including upconversion/downconversion 174 to millimeter wave frequencies, power combiner/divider 176, programmable phase shifting 178 and power amplifiers (PA) 180, low noise amplifiers (LNA) 182, as well as control and power management circuitry 184A and 184B. This arrangement can be different from Wi-Fi or cellular implementations, which generally have all RF and baseband functionality integrated into a single unit and only antennas connected remotely via coaxial cables.

This architectural difference can be driven by the very large power losses in coaxial cables at millimeter wave frequencies. These power losses can reduce the transmit power at the antenna and reduce receive sensitivity. In order to avoid this issue, in some aspects, PAs 180 and LNAs 182 may be moved to the RFEM 115 with integrated antennas. In addition, the RFEM 115 may include upconversion/downconversion 174 so that the IF signals over the coaxial cable 190 can be at a lower frequency. Additional system context for mmWave 5G apparatuses, techniques and features is discussed herein below.

Figure 2:
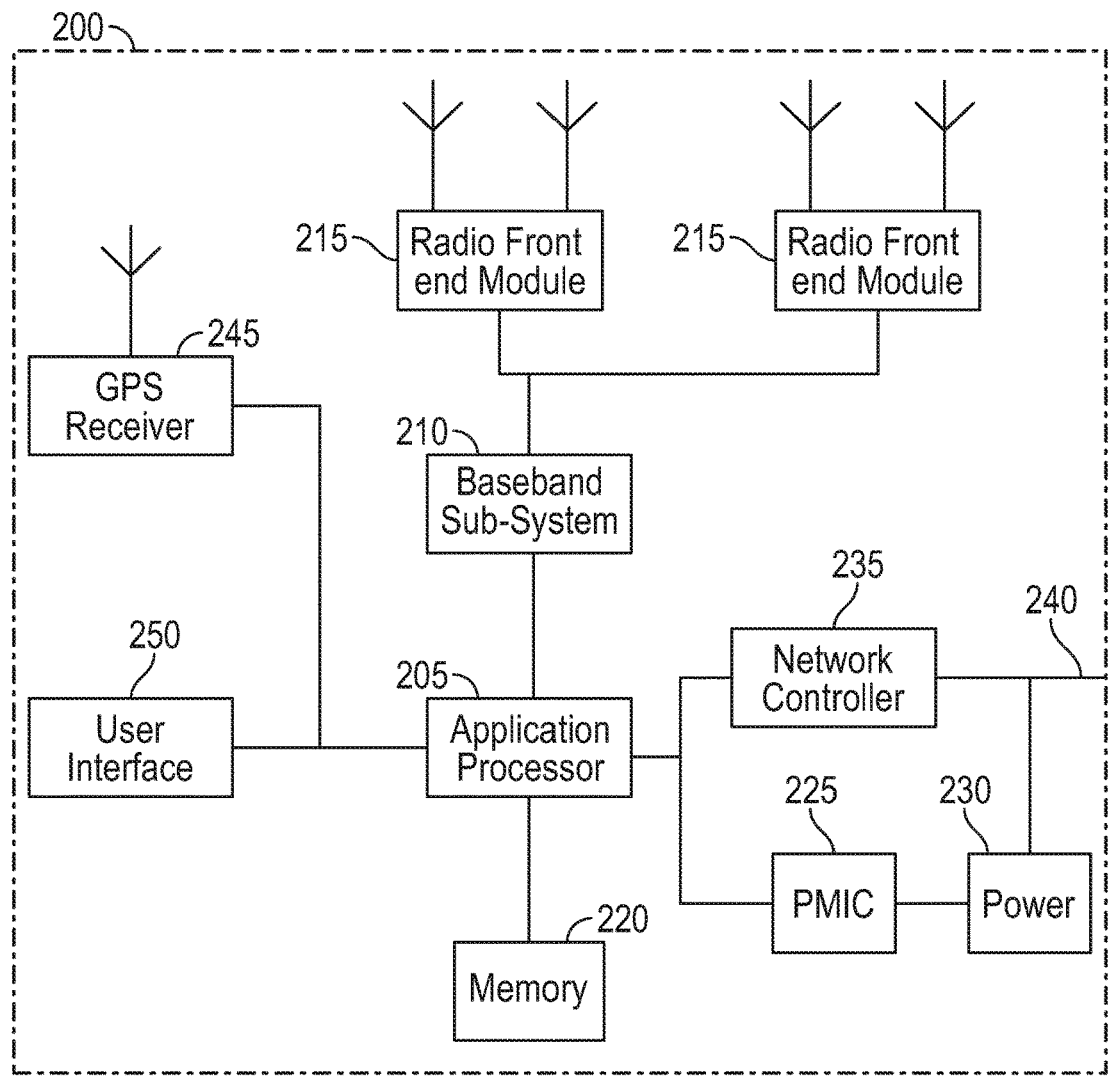
FIG. 2 illustrates an exemplary base station radio head according to some aspects.

FIG. 2 illustrates an exemplary base station or infrastructure equipment radio head according to some aspects. The base station radio head 200 may include one or more of application processor 205, baseband processors 210, one or more radio front end modules 215, memory 220, power management integrated circuitry (PMIC) 225, power tee circuitry 230, network controller 235, network interface connector 240, satellite navigation receiver (e.g., GPS receiver) 245, and user interface 250.

In some aspects, application processor 205 may include one or more CPU cores and one or more of cache memory, low drop-out voltage regulators (LDOs), interrupt controllers, serial interfaces such as SPI, I2C or universal programmable serial interface, real time clock (RTC), timer-counters including interval and watchdog timers, general purpose IO, memory card controllers such as SD/MMC or similar, USB interfaces, MIPI interfaces and Joint Test Access Group (JTAG) test access ports.

In some aspects, baseband processor 210 may be implemented, for example, as a solder-down substrate including one or more integrated circuits, a single packaged integrated circuit soldered to a main circuit board or a multi-chip sub-system including two or more integrated circuits.

In some aspects, memory 220 may include one or more of volatile memory including dynamic random access memory (DRAM) and/or synchronous DRAM (SDRAM), and non-volatile memory (NVM) including high-speed electrically erasable memory (commonly referred to as Flash memory), phase-change random access memory (PRAM), magnetoresistive random access memory (MRAM), and/or a three-dimensional crosspoint memory. Memory 220 may be implemented as one or more of solder down packaged integrated circuits, socketed memory modules and plug-in memory cards.

In some aspects, power management integrated circuitry 225 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 230 may provide for electrical power drawn from a network cable. Power tee circuitry 230 may provide both power supply and data connectivity to the base station radio head 200 using a single cable.

In some aspects, network controller 235 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver 245 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 245 may provide, to application processor 205, data which may include one or more of position data or time data. Time data may be used by application processor 205 to synchronize operations with other radio base stations or infrastructure equipment.

In some aspects, user interface 250 may include one or more of buttons. The buttons may include a reset button. User interface 250 may also include one or more indicators such as LEDs and a display screen.

Figure 3A:
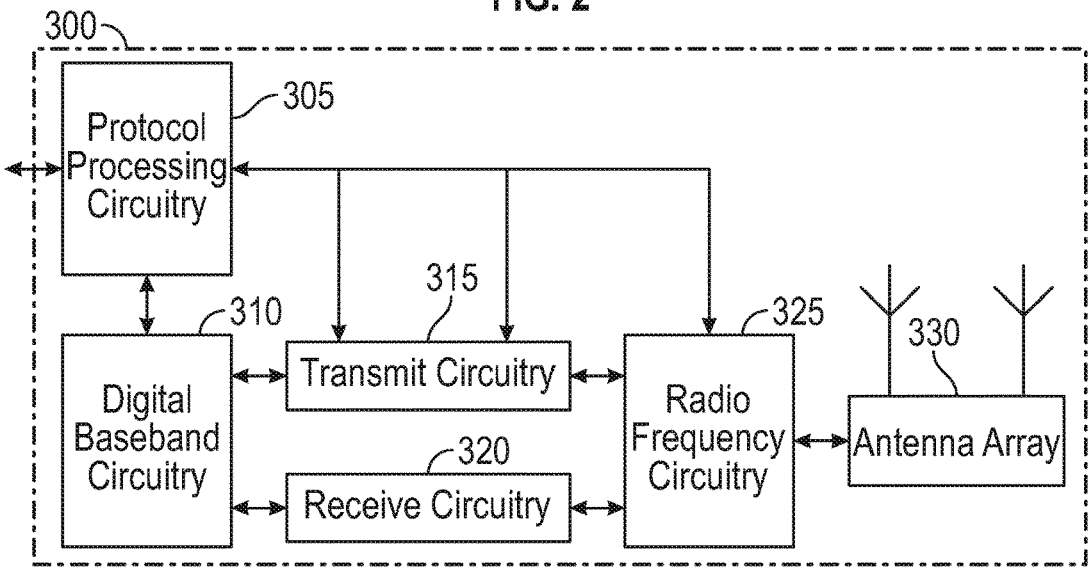
FIG. 3A illustrates exemplary wireless communication circuitry according to some aspects.
Figure 3B:
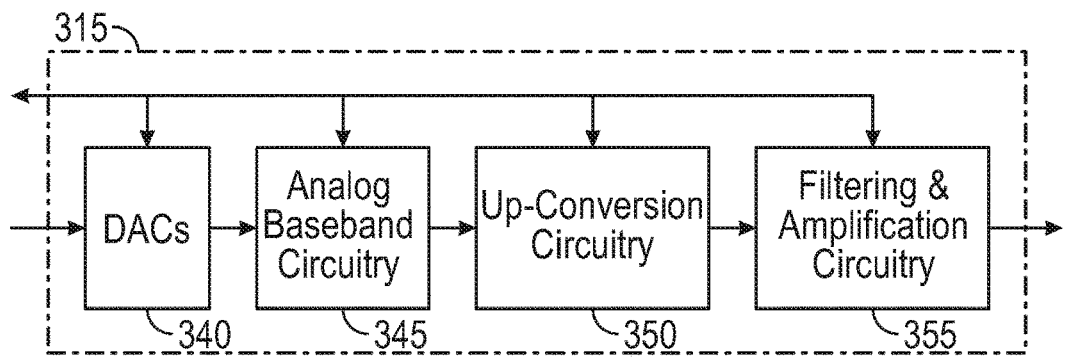
FIG. 3B illustrates aspects of exemplary transmit circuitry illustrated in FIG. 3A according to some aspects.
Figure 3C:
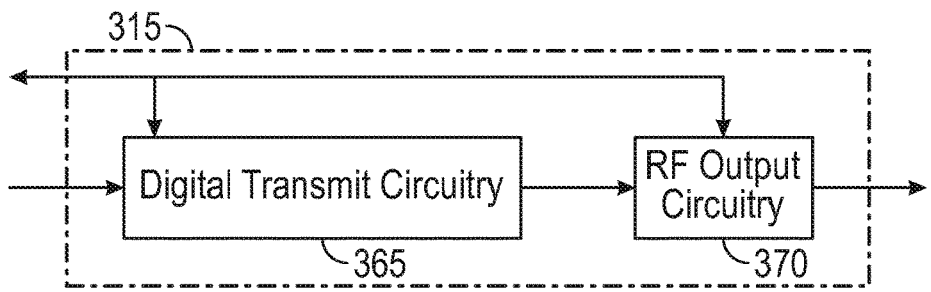
FIG. 3C illustrates aspects of exemplary transmit circuitry illustrated in FIG. 3A according to some aspects.
Figure 3D:
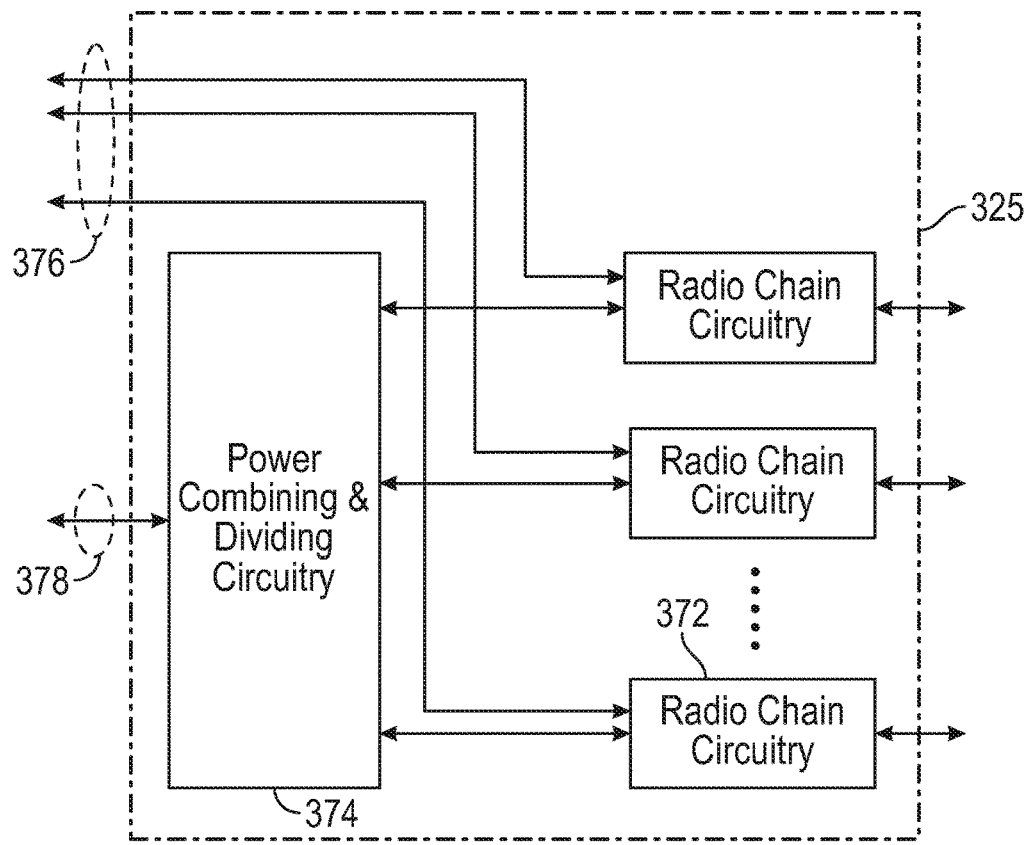
FIG. 3D illustrates aspects of exemplary radio frequency circuitry illustrated in FIG. 3A according to some aspects.
Figure 3E:
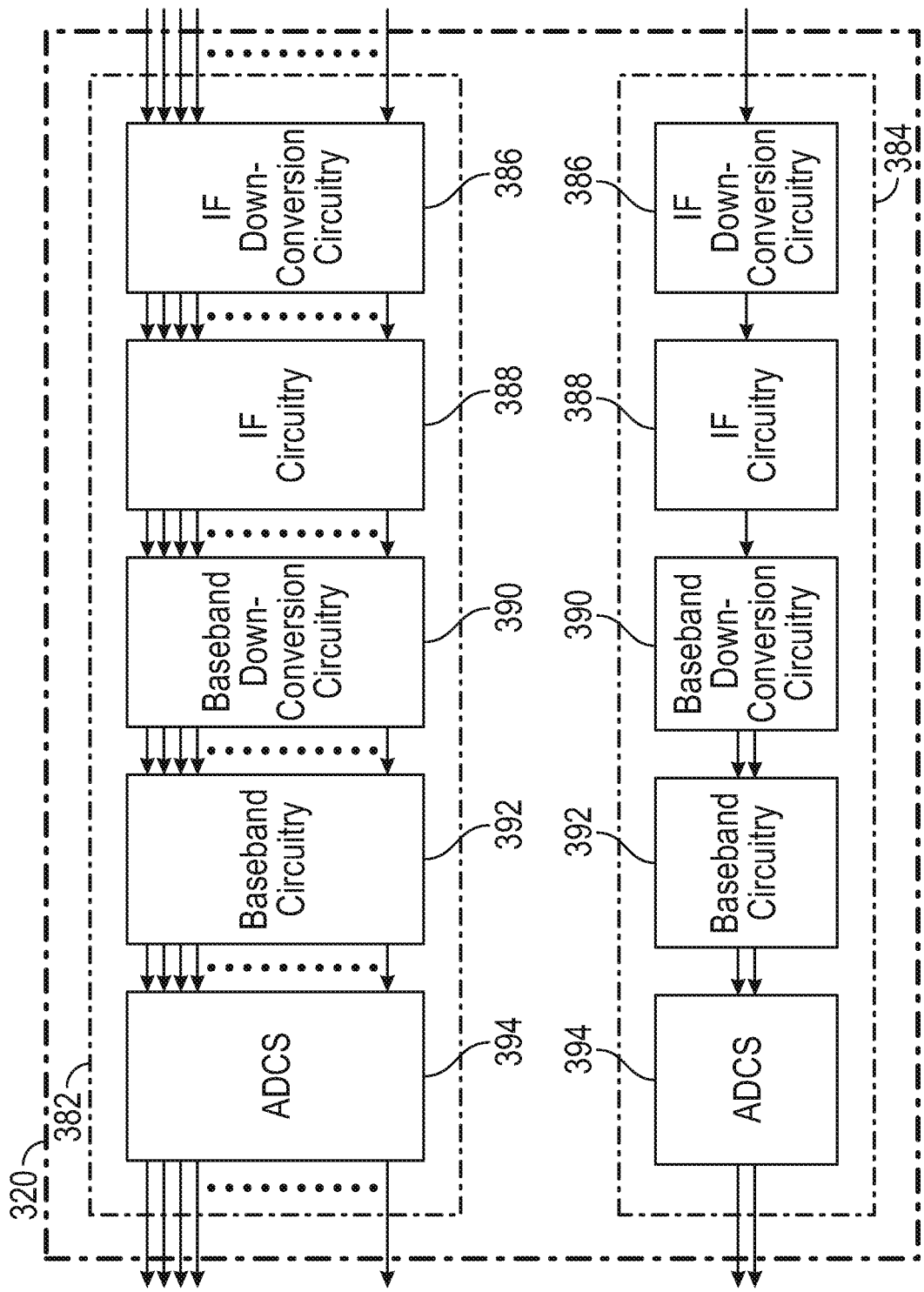
FIG. 3E illustrates aspects of exemplary receive circuitry in FIG. 3A according to some aspects.

FIG. 3A illustrates exemplary wireless communication circuitry according to some aspects; FIGS. 3B and 3C illustrate aspects of transmit circuitry shown in FIG. 3A according to some aspects; FIG. 3D illustrates aspects of radio frequency circuitry shown in FIG. 3A according to some aspects; FIG. 3E illustrates aspects of receive circuitry in FIG. 3A according to some aspects. Wireless communication circuitry 300 shown in FIG. 3A may be alternatively grouped according to functions. Components illustrated in FIG. 3A are provided here for illustrative purposes and may include other components not shown in FIG. 3A.

Wireless communication circuitry 300 may include protocol processing circuitry 305 (or processor) or other means for processing. Protocol processing circuitry 305 may implement one or more of medium access control (MAC), radio link control (RLC), packet data convergence protocol (PDCP), radio resource control (RRC) and non-access stratum (NAS) functions, among others. Protocol processing circuitry 305 may include one or more processing cores to execute instructions and one or more memory structures to store program and data information.

Wireless communication circuitry 300 may further include digital baseband circuitry 310. Digital baseband circuitry 310 may implement physical layer (PHY) functions including one or more of hybrid automatic repeat request (HARQ) functions, scrambling and/or descrambling, coding and/or decoding, layer mapping and/or de-mapping, modulation symbol mapping, received symbol and/or bit metric determination, multi-antenna port pre-coding and/or decoding which may include one or more of space-time, space-frequency or spatial coding, reference signal generation and/or detection, preamble sequence generation and/or decoding, synchronization sequence generation and/or detection, control channel signal blind decoding, and other related functions.

Wireless communication circuitry 300 may further include transmit circuitry 315, receive circuitry 320 and/or antenna array circuitry 330. Wireless communication circuitry 300 may further include RF circuitry 325. In some aspects, RF circuitry 325 may include one or multiple parallel RF chains for transmission and/or reception. Each of the RF chains may be connected to one or more antennas of antenna array circuitry 330.

In some aspects, protocol processing circuitry 305 may include one or more instances of control circuitry. The control circuitry may provide control functions for one or more of digital baseband circuitry 310, transmit circuitry 315, receive circuitry 320, and/or RF circuitry 325.

FIGS. 3B and 3C illustrate aspects of transmit circuitry shown in FIG. 3A according to some aspects. Transmit circuitry 315 shown in FIG. 3B may include one or more of digital to analog converters (DACs) 340, analog baseband circuitry 345, up-conversion circuitry 350 and/or filtering and amplification circuitry 355. DACs 340 may convert digital signals into analog signals. Analog baseband circuitry 345 may perform multiple functions as indicated below. Up-conversion circuitry 350 may up-convert baseband signals from analog baseband circuitry 345 to RF frequencies (e.g., mmWave frequencies). Filtering and amplification circuitry 355 may filter and amplify analog signals. Control signals may be supplied between protocol processing circuitry 305 and one or more of DACs 340, analog baseband circuitry 345, up-conversion circuitry 350 and/or filtering and amplification circuitry 355.

Transmit circuitry 315 shown in FIG. 3C may include digital transmit circuitry 365 and RF circuitry 370. In some aspects, signals from filtering and amplification circuitry 355 may be provided to digital transmit circuitry 365. As above, control signals may be supplied between protocol processing circuitry 305 and one or more of digital transmit circuitry 365 and RF circuitry 370.

FIG. 3D illustrates aspects of radio frequency circuitry shown in FIG. 3A according to some aspects. Radio frequency circuitry 325 may include one or more instances of radio chain circuitry 372, which in some aspects may include one or more filters, power amplifiers, low noise amplifiers, programmable phase shifters and power supplies.

Radio frequency circuitry 325 may also in some aspects include power combining and dividing circuitry 374. In some aspects, power combining and dividing circuitry 374 may operate bidirectionally, such that the same physical circuitry may be configured to operate as a power divider when the device is transmitting, and as a power combiner when the device is receiving. In some aspects, power combining and dividing circuitry 374 may include one or more wholly or partially separate circuitries to perform power dividing when the device is transmitting and power combining when the device is receiving. In some aspects, power combining and dividing circuitry 374 may include passive circuitry including one or more two-way power divider/combiners arranged in a tree. In some aspects, power combining and dividing circuitry 374 may include active circuitry including amplifier circuits.

In some aspects, radio frequency circuitry 325 may connect to transmit circuitry 315 and receive circuitry 320 in FIG. 3A. Radio frequency circuitry 325 may connect to transmit circuitry 315 and receive circuitry 320 via one or more radio chain interfaces 376 and/or a combined radio chain interface 378. In some aspects, one or more radio chain interfaces 376 may provide one or more interfaces to one or more receive or transmit signals, each associated with a single antenna structure. In some aspects, the combined radio chain interface 378 may provide a single interface to one or more receive or transmit signals, each associated with a group of antenna structures.

FIG. 3E illustrates aspects of receive circuitry in FIG. 3A according to some aspects. Receive circuitry 320 may include one or more of parallel receive circuitry 382 and/or one or more of combined receive circuitry 384. In some aspects, the one or more parallel receive circuitry 382 and one or more combined receive circuitry 384 may include one or more Intermediate Frequency (IF) down-conversion circuitry 386, IF processing circuitry 388, baseband down-conversion circuitry 390, baseband processing circuitry 392 and analog-to-digital converter (ADC) circuitry 394. As used herein, the term "intermediate frequency" refers to a frequency to which a carrier frequency (or a frequency signal) is shifted as in intermediate step in transmission, reception, and/or signal processing. IF down-conversion circuitry 386 may convert received RF signals to IF. IF processing circuitry 388 may process the IF signals, e.g., via filtering and amplification. Baseband down-conversion circuitry 390 may convert the signals from IF processing circuitry 388 to baseband. Baseband processing circuitry 392 may process the baseband signals, e.g., via filtering and amplification. ADC circuitry 394 may convert the processed analog baseband signals to digital signals.

FIG. 4 illustrates exemplary RF circuitry of FIG. 3A according to some aspects. In an aspect, RF circuitry 325 in FIG. 3A (depicted in FIG. 4 using reference number 425) may include one or more of the IF interface circuitry 405, filtering circuitry 410, up-conversion and down-conversion circuitry 415, synthesizer circuitry 420, filtering and amplification circuitry 424, power combining and dividing circuitry 430, and radio chain circuitry 435.

FIG. 5A and FIG. 5B illustrate aspects of a radio front-end module (RFEM) useable in the circuitry shown in FIG. 1 and FIG. 2, according to some aspects. FIG. 5A illustrates an aspect of a RFEM according to some aspects. RFEM 500 incorporates a millimeter wave RFEM 505 and one or more above-six gigahertz radio frequency integrated circuits (RFIC) 515 and/or one or more sub-six gigahertz RFICs 522. In this aspect, the one or more sub-six gigahertz RFICs 515 and/or one or more sub-six gigahertz RFICs 522 may be physically separated from millimeter wave RFEM 505. RFICs 515 and 522 may include connection to one or more antennas 520. RFEM 505 may include multiple antennas 510.

FIG. 5B illustrates an alternate aspect of a radio front end module, according to some aspects. In this aspect both millimeter wave and sub-six gigahertz radio functions may be implemented in the same physical radio front end module (RFEM) 530. RFEM 530 may incorporate both millimeter wave antennas 535 and sub-six gigahertz antennas 540.

Figure 6:
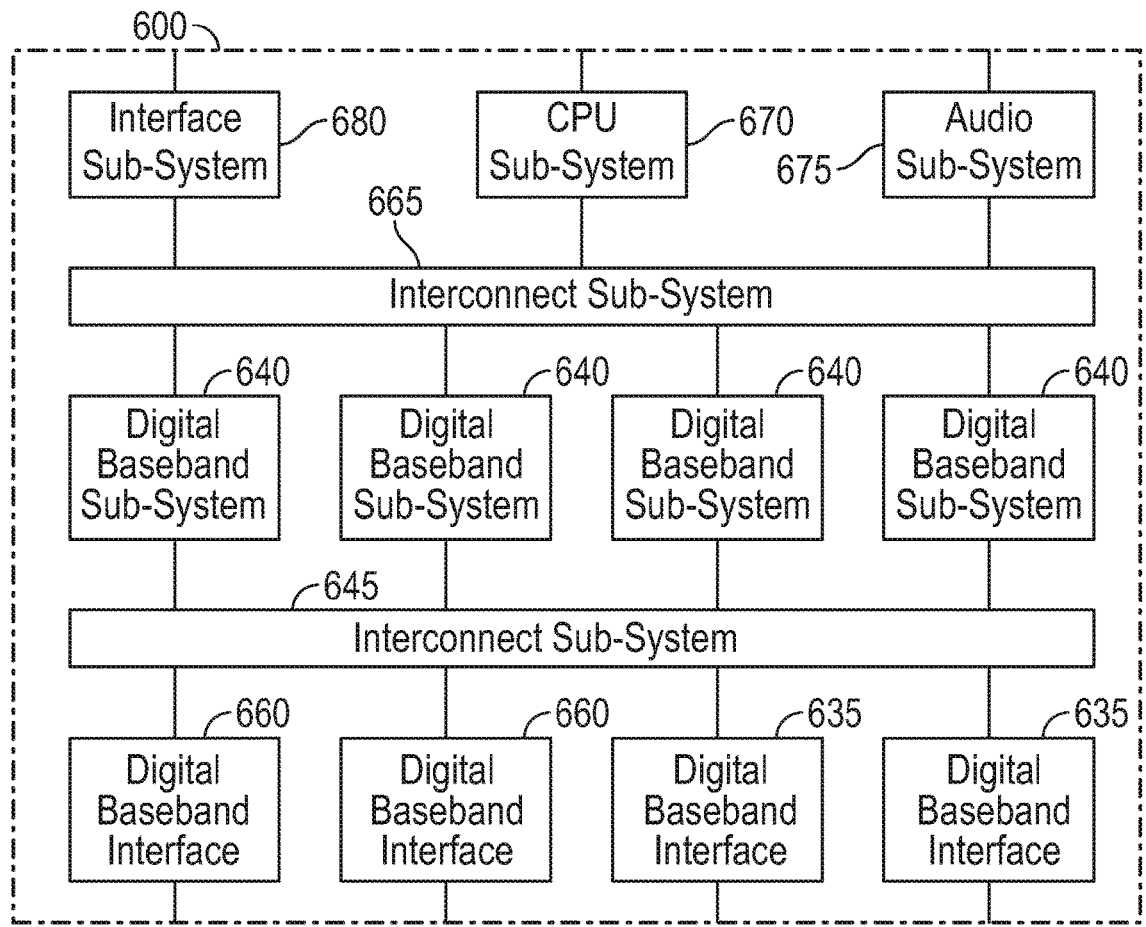
FIG. 6 illustrates an exemplary multi-protocol baseband processor useable in FIG. 1 or FIG. 2, according to some aspects.

FIG. 6 illustrates a multi-protocol baseband processor 600 useable in the system and circuitry shown in FIG. 1 or FIG. 2, according to some aspects. In an aspect, baseband processor may contain one or more digital baseband subsystems 640A, 640B, 640C, 640D, also herein referred to collectively as digital baseband subsystems 640.

In an aspect, the one or more digital baseband subsystems 640A, 640B, 640C, 640D may be coupled via interconnect subsystem 665 to one or more of CPU subsystem 670, audio subsystem 675 and interface subsystem 680. In an aspect, the one or more digital baseband subsystems 640 may be coupled via interconnect subsystem 645 to one or more of each of digital baseband interface 660A, 660B and mixed-signal baseband subsystem 635A, 635B.

In an aspect, interconnect subsystem 665 and 645 may each include one or more of each of buses point-to-point connections and network-on-chip (NOC) structures. In an aspect, audio subsystem 675 may include one or more of digital signal processing circuitry, buffer memory, program memory, speech processing accelerator circuitry, data converter circuitry such as analog-to-digital and digital-to-analog converter circuitry, and analog circuitry including one or more of amplifiers and filters.

Figure 7:
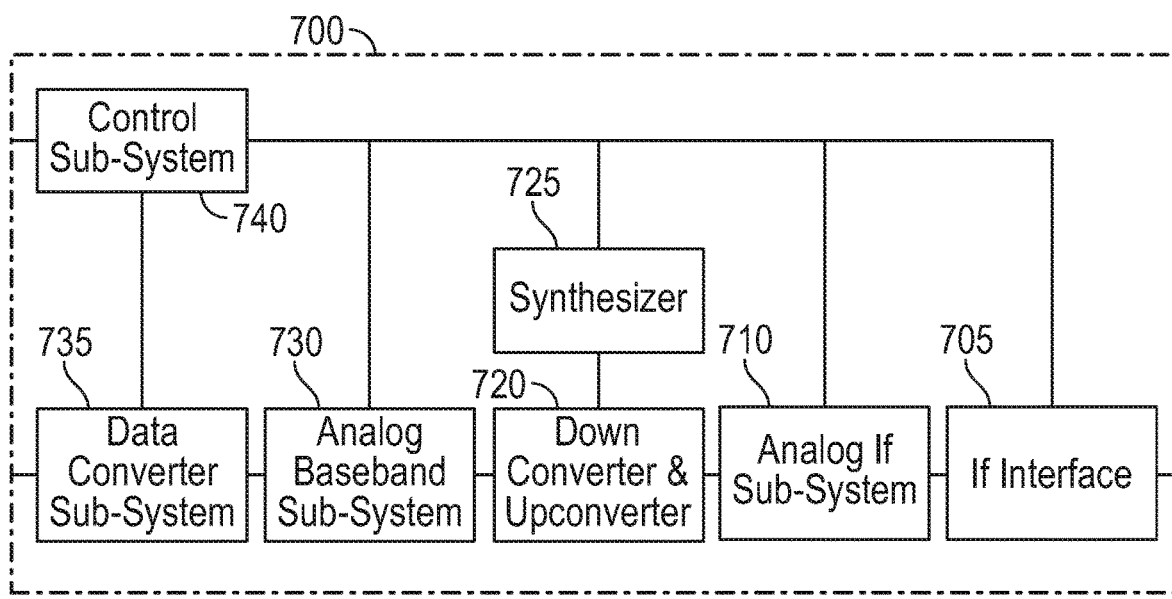
FIG. 7 illustrates an exemplary mixed signal baseband subsystem, according to some aspects.

FIG. 7 illustrates an exemplary of a mixed signal baseband subsystem 700, according to some aspects. In an aspect, mixed signal baseband subsystem 700 may include one or more of IF interface 705, analog IF subsystem 710, down-converter and up-converter subsystem 720, analog baseband subsystem 730, data converter subsystem 735, synthesizer 725 and control subsystem 740.

Figure 8A:
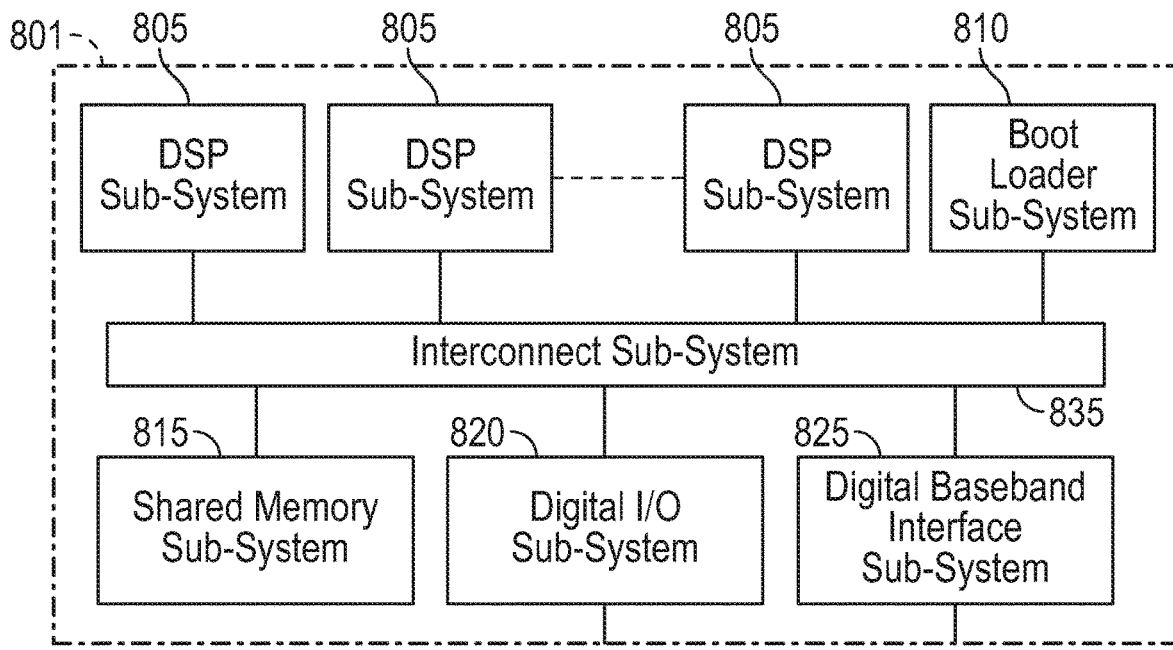
FIG. 8A illustrates an exemplary digital baseband subsystem, according to some aspects.
Figure 8B:
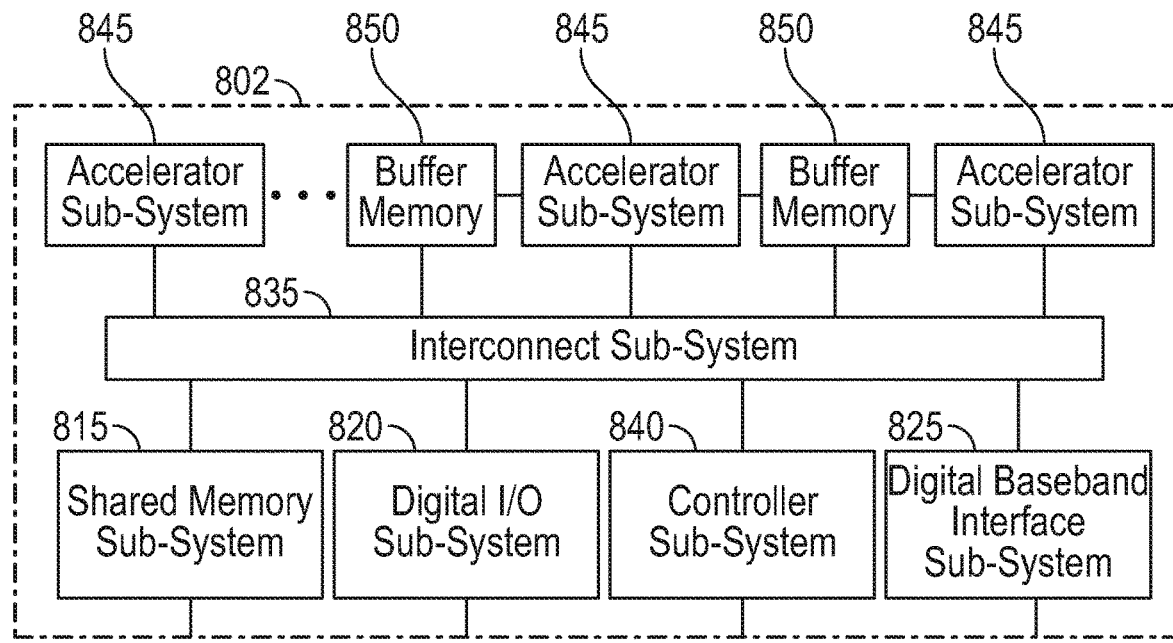
FIG. 8B illustrates an alternate aspect of an exemplary baseband processing subsystem, according to some aspects.

FIG. 8A illustrates a digital baseband processing subsystem 801, according to some aspects. FIG. 8B illustrates an alternate aspect of a digital baseband processing subsystem 802, according to some aspects.

In an aspect of FIG. 8A, the digital baseband processing subsystem 801 may include one or more of each of digital signal processor (DSP) subsystems 805A, 805B, . . . 805N, interconnect subsystem 835, boot loader subsystem 810, shared memory subsystem 815, digital I/O subsystem 820, and digital baseband interface subsystem 825.

In an aspect of FIG. 8B, digital baseband processing subsystem 802 may include one or more of each of accelerator subsystem 845A, 845B, . . . 845N, buffer memory 850A, 850B, . . . 850N, interconnect subsystem 835, shared memory subsystem 815, digital I/O subsystem 820, controller subsystem 840 and digital baseband interface subsystem 825.

In an aspect, boot loader subsystem 810 may include digital logic circuitry configured to perform configuration of the program memory and running state associated with each of the one or more DSP subsystems 805. Configuration of the program memory of each of the one or more DSP subsystems 805 may include loading executable program code from storage external to digital baseband processing subsystems 801 and 802. Configuration of the running state associated with each of the one or more DSP subsystems 805 may include one or more of the steps of: setting the state of at least one DSP core which may be incorporated into each of the one or more DSP subsystems 805 to a state in which it is not running, and setting the state of at least one DSP core which may be incorporated into each of the one or more DSP subsystems 805 into a state in which it begins executing program code starting from a predefined memory location.

In an aspect, shared memory subsystem 815 may include one or more of read-only memory (ROM), static random access memory (SRAM), embedded dynamic random access memory (eDRAM) and/or non-volatile random access memory (NVRAM).

In an aspect, digital I/O subsystem 820 may include one or more of serial interfaces such as Inter-Integrated Circuit (I2C), Serial Peripheral Interface (SPI) or other 1, 2 or 3-wire serial interfaces, parallel interfaces such as general-purpose input-output (GPIO), register access interfaces and direct memory access (DMA). In an aspect, a register access interface implemented in digital I/O subsystem 820 may permit a microprocessor core external to digital baseband processing subsystem 801 to read and/or write one or more of control and data registers and memory. In an aspect, DMA logic circuitry implemented in digital I/O subsystem 820 may permit transfer of contiguous blocks of data between memory locations including memory locations internal and external to digital baseband processing subsystem 801.

In an aspect, digital baseband interface subsystem 825 may provide for the transfer of digital baseband samples between baseband processing subsystem and mixed signal baseband or radio-frequency circuitry external to digital baseband processing subsystem 801. In an aspect, digital baseband samples transferred by digital baseband interface subsystem 825 may include in-phase and quadrature (I/Q) samples.

In an aspect, controller subsystem 840 may include one or more of each of control and status registers and control state machines. In an aspect, control and status registers may be accessed via a register interface and may provide for one or more of: starting and stopping operation of control state machines, resetting control state machines to a default state, configuring optional processing features, and/or configuring the generation of interrupts and reporting the status of operations. In an aspect, each of the one or more control state machines may control the sequence of operation of each of the one or more accelerator subsystems 845. There may be examples of implementations of both FIG. 8A and FIG. 8B in the same baseband subsystem.

Figure 9:
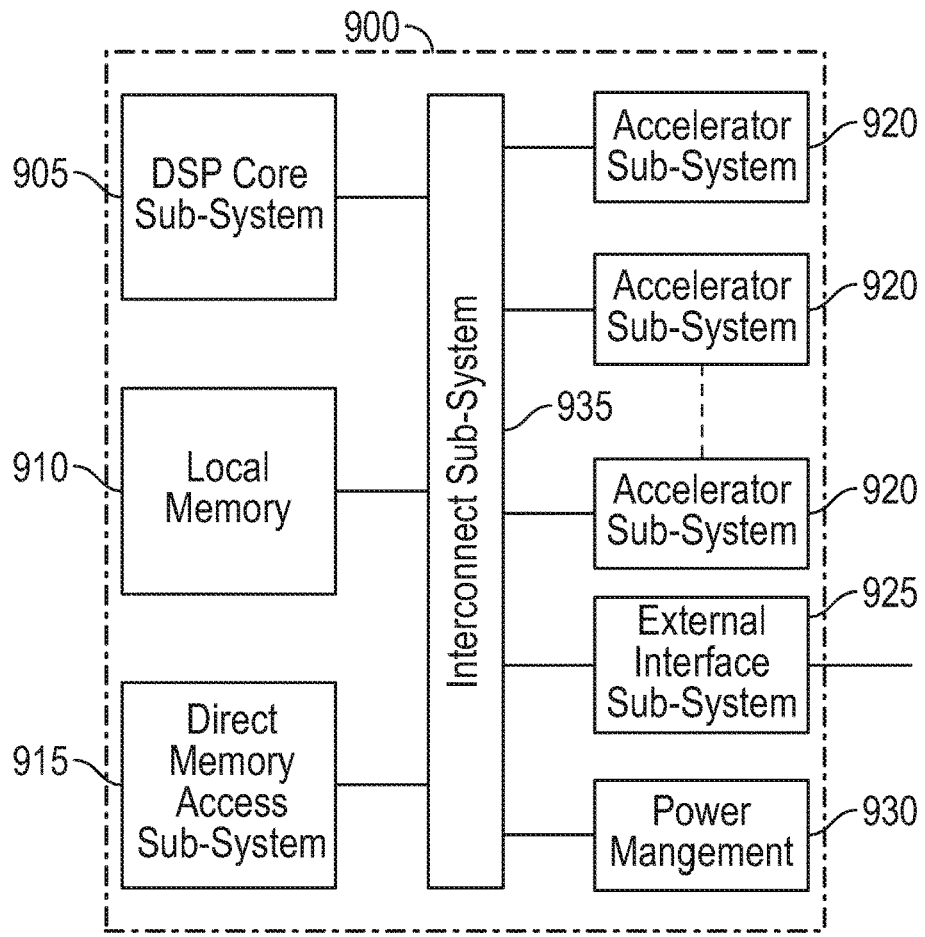
FIG. 9 illustrates an exemplary digital signal processor subsystem, according to some aspects.

FIG. 9 illustrates a digital signal processor (DSP) subsystem 900 according to some aspects. In an aspect, DSP subsystem 900 may include one or more of each of DSP core subsystem 905, local memory 910, direct memory access (DMA) subsystem 915, accelerator subsystem 920A, 920B . . . 920N, external interface subsystem 925, power management circuitry 930 and interconnect subsystem 935.

In an aspect, the local memory 910 may include one or more of each of read-only memory, static random access memory or embedded dynamic random access memory.

In an aspect, the DMA subsystem 915 may provide registers and control state machine circuitry adapted to transfer blocks of data between memory locations including memory locations internal and external to DSP subsystem 900.

In an aspect, external interface subsystem 925 may provide for access by a microprocessor system external to DSP subsystem 900 to one or more of memory, control registers and status registers which may be implemented in DSP subsystem 900. In an aspect, external interface subsystem 925 may provide for transfer of data between local memory 910 and storage external to DSP subsystem 900 under the control of one or more of the DMA subsystem 915 and the DSP core subsystem 905.

Aspects for Spur Cancellation and Mitigation

Wireless communication circuitry (for example, any of the elements show in FIGS. 3A, 3B, 3C, 3D, and 3E) can produce signal leakage and nonlinearities, resulting in unmodulated spurs (e.g., CW spurs). For example, interference may be often generated due to the presence of spur frequency components in outputs of LOs or crystal oscillators (XOs) that perform up and down translations between baseband and RF signals. This interference may need to be cancelled. Available systems and methods for cancellation are complex, area intensive, and slow to converge. Systems and methods according to aspects described herein use a compact architecture for CW spur cancellation using a least squares (LS) adaptation block for improved convergence speed and accuracy. Other systems and methods perform constant, periodic, or other ongoing searches for spurious products. Systems and methods according to at least these aspects can learn which spurious products are most problematic, extract a rule to describe such problematic spurious products, and allocate mitigation resources in response to this learning.

Figure 10:
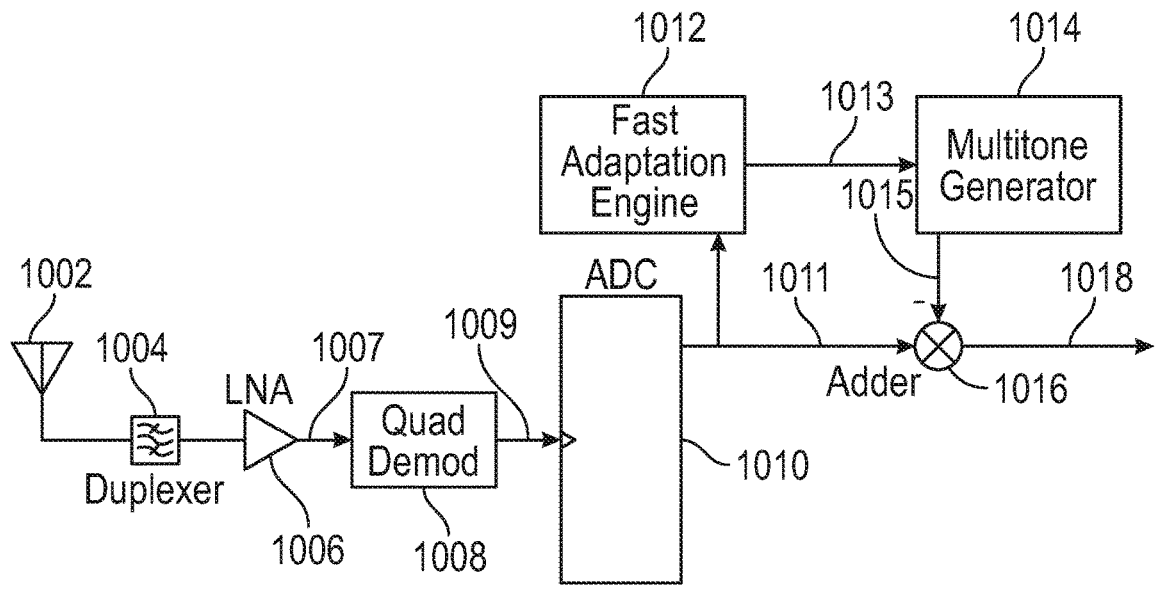
FIG. 10 illustrates further aspects of exemplary receive circuitry including continuous wave (CW) spur cancellation components, according to some aspects.

FIG. 10 illustrates further aspects of receive circuitry 1000 to include CW spur cancellation components, according to some aspects. An RF signal is sensed through an antenna 1002 and processed through RF circuitry 325 (FIG.

3A), filtered at 1004 to select the band of interest where the received signal is located, and amplified at low noise amplifier (LNA) 1006. The LNA 1006 output signal 1007 is frequency downconverted to baseband and demodulated into constituent in-phase (I) and quadrature (Q) components by demodulator 1008. The IQ output signals 1009 are digitized in an ADC block 1010 and low-pass filtered to create baseband signal 1011. Baseband signal 1011 includes the received signal plus undesired signals (e.g., CW spurs) that can be detrimental to signal quality. As described earlier herein, such undesired signals can be injected into the desired signal by, for example, LO or XO signal leakages that are nonlinearly processed by receiver circuitry (e.g., any of the components of FIGS. 3A, 3B, 3C, 3D, and 3E).

Example aspects described herein can be used to remove or cancel CW spurs from baseband signal 1011. Systems according to aspects described herein can include signal estimation circuitry 1012 (e.g., fast adaptation circuitry), which processes baseband signal 1011 and uses techniques, such as a least-squares (LS) method, to estimate the parameters of a regression model. For example, the signal estimation circuitry 1012 can generate estimates of amplitude and frequency for unmodulated spurs within the baseband signal 1011.

An example adaptation method based on LS estimation mathematical principles, to be calculated or determined within signal estimation circuitry 1012, is described below with respect to Equation (1):

$$\vec{c} = B^{-1} \vec{a} \tag{1}$$

where $B^{-1}$ is the inverse of a symmetric matrix formed with products of the complex tone terms. For example, in use cases with three complex tones:

$$B = \begin{bmatrix} N & \sum_1^N e^{j(w2-w1)t} & \sum_1^N e^{j(w3-w1)t} \\ \sum_1^N e^{j(w1-w2)t} & N & \sum_1^N e^{j(w3-w2)t} \\ \sum_1^N e^{j(w1-w3)t} & \sum_1^N e^{j(w2-w3)t} & N \end{bmatrix} \tag{2}$$

where N is the number of data samples used for adaptation, $\vec{c}$ is a vector of complex Cartesian coefficients for CW spur mitigation, and a is a projection vector according to $\vec{a} = [\sum_1^N e^{-jw1t} x \sum_1^N e^{-jw2t} x \sum_1^N e^{-jw3t} x]^T$, where x denotes the IQ received signal 1009.

The inverse of B can be determined analytically:

$$B^{-1} = \frac{1}{\Delta} \begin{bmatrix} -B_{12}^2 + B_{11}B_{22} & B_{02}B_{12} - B_{01}B_{22} & B_{01}B_{12} - B_{02}B_{11} \\ B_{02}B_{12} - B_{01}B_{22} & -B_{02}^2 + B_{00}B_{22} & B_{01}B_{02} - B_{00}B_{12} \\ B_{01}B_{12} - B_{02}B_{11} & B_{01}B_{02} - B_{00}B_{12} & -B_{01}^2 + B_{00}*B_{11} \end{bmatrix} \tag{3}$$

where $\Delta$ is the matrix determinant computed according to:

$$\Delta = -B_{22}B_{01}^2 + 2B_{01}B_{02}B_{12} - B_{11}B_{02}^2 - B_{00}B_{12}^2 + B_{00}B_{11}B_{22} \tag{4}$$

An example regression model implemented in the signal estimation circuitry 1012 can be shown by Equation (5):

$$x(kT_s) = f(e^{jw_n kT_s}, c_n, w_n) \tag{5}$$

where x is baseband signal 1011, k is a constant, $T_s$ is a period determined according to the fundamental spur frequency, $c_n$ are complex coefficient amplitudes as determined in Equation (1), and $w_n$ are real frequencies.

According to the model of Equation (5), CW spurs are represented as a linear combination of n complex exponentials with complex coefficient amplitudes $c_n$ and real frequencies $w_n$. Complex coefficient amplitudes $c_n$ and real frequencies $w_n$ are provided at 1013 to the multi-tone generator circuitry 1014. While Equation (5) is one example regression model, aspects are not limited thereto, and the regression models can include other linear models or other non-linear models.

The multi-tone generator circuitry 1014 generates a composite CW spur cancellation signal $y = \sum_1^N c_n e^{jw_n kT_s}$ (shown as element 1015 in FIG. 10), which is an additive aggregation of individual spur components based on the estimates of amplitude and frequency for unmodulated spurs within the baseband signal 1011. Adder circuitry 1016 subtracts the spur cancellation signal 1015 from the baseband signal 1011 to generate an unmodulated spur cancelled signal 1018.

Figure 11:
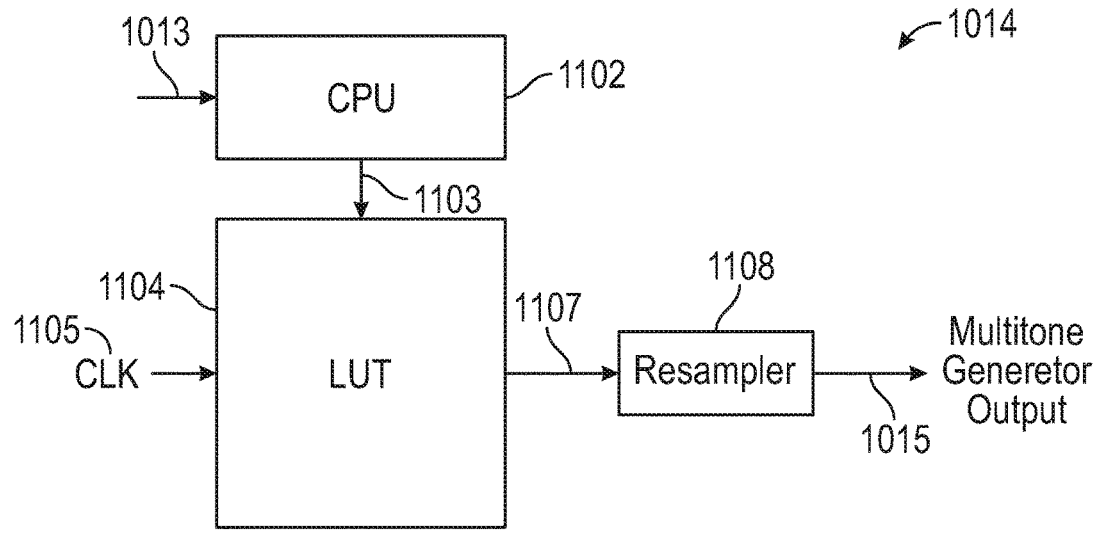
FIG. 11 illustrates example multi-tone generator circuitry, according to some aspects.
Figure 12:
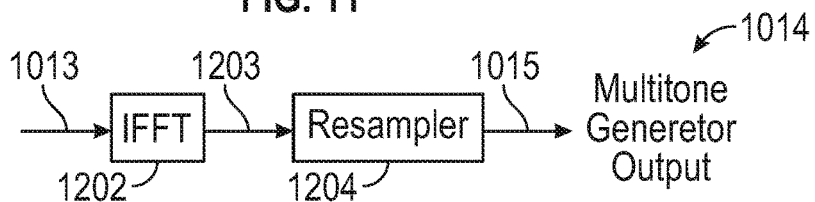
FIG. 12 illustrates alternative example multi-tone generator circuitry, according to some aspects.

FIG. 11 illustrates example multi-tone generator circuitry 1014, according to some aspects. FIG. 12 illustrates alternative example multi-tone generator circuitry 1014, according to some aspects. Referring to FIG. 11, the multi-tone generator circuitry 1014 of FIG. 11 can be used to generate a composite CW spur cancellation signal for uses cases in which the CW spurs are integer multiples of a fundamental spur frequency. In at least these aspects, processing circuitry 1102, which can include a central processing unit (CPU) or other processor, calculates the composite cancellation signal y over a period and, at 1103, provides the composite spur cancellation signal to storage 1104 (e.g., a look-up table or other data structure). The period for calculation is determined according to a period of the fundamental spur signal, using a sample rate based on the maximum frequencies of the spurs to be cancelled. Entries of the storage 1104 (e.g., one period of the composite cancellation signal y) are iteratively read and clocked using clock 1105 to provide signal 1107. Signal 1107 is then resampled using resampler 1108 to generate the multi-tone generator output 1015, which will then be at a frequency to match the sampling rate of downstream processing elements (e.g., other elements of receiver circuitry shown in FIG. 3E such as baseband circuitry 392).

Referring to FIG. 12, the multi-tone generator circuitry 1014 can be used to generate a composite CW spur cancellation signal for uses cases in which the CW spurs are not integer multiples of a fundamental spur frequency. In at least these aspects, processing circuitry 1202 calculates the composite cancellation signal y using a method such as inverse Fourier transform (IFFT). Similarly to FIG. 11, the output 1203 is resampled using resampler 1204 to a higher frequency to match the sampling rate of downstream processing elements (e.g., other elements of receiver circuitry shown in FIG. 3E such as baseband circuitry 392).

Figure 13:
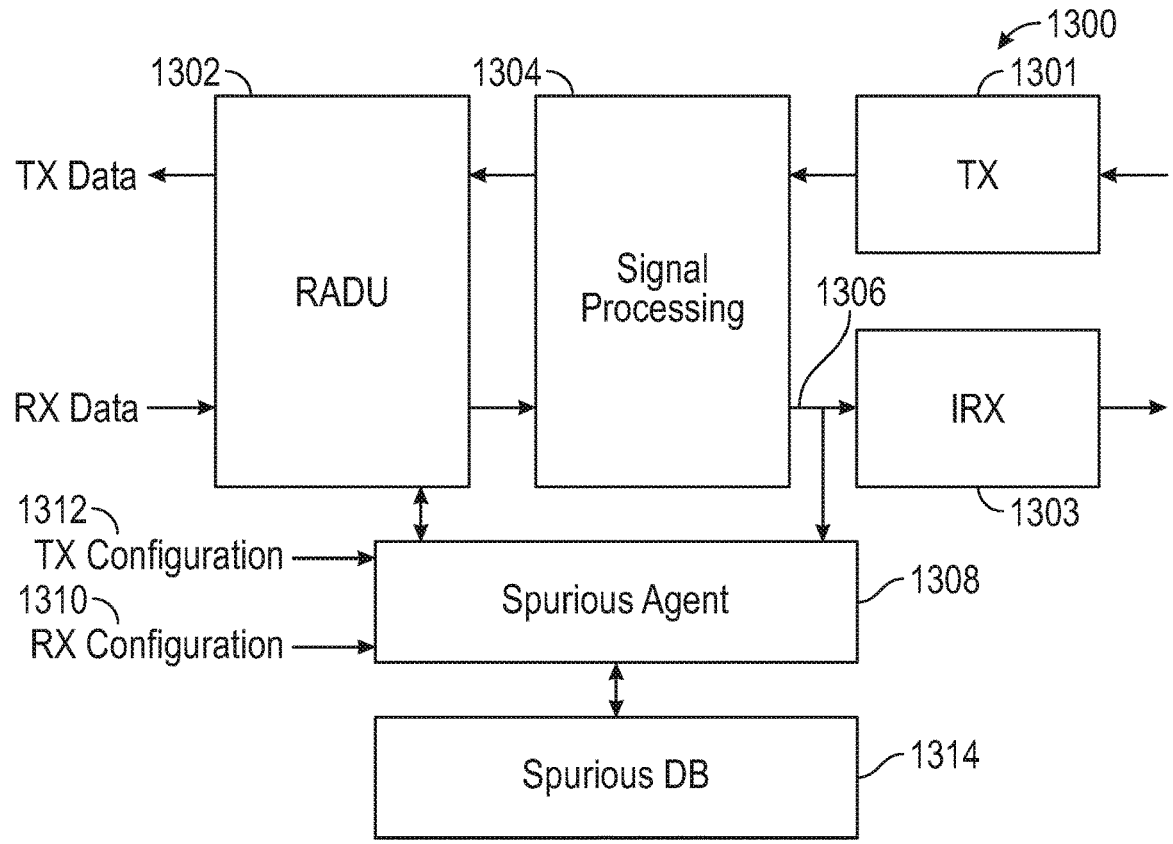
FIG. 13 illustrates an example architecture for spurious mitigation, according to some aspects.

As mentioned earlier herein, systems and methods according to other aspects can mitigate spurs, e.g., CW spurs by performing constant, periodic, or other ongoing searches for spurious products. Systems and methods according to at least these aspects can learn which spurious products are most problematic, extract a rule to describe such problematic spurious products, and allocate mitigation resources in response to this learning. FIG. 13 illustrates an example architecture 1300 for spurious mitigation, according to some aspects. Elements of FIG. 13 can be housed in RF circuitry (e.g., RF circuitry 325 in FIG. 3A) or with baseband circuitry (e.g., digital baseband circuitry 310 in FIG. 3A) or other elements of transmit circuitry 315 or receive circuitry 320.

Referring to FIG. 13, the Radio Access Data Unit (RADU) 1302 can include circuitry to perform RF signal processing (e.g., digital signal processing (DSP) in the baseband. As such, the RADU 1302 can include, incorporate, or perform functions of digital baseband circuitry 310 (FIG. 3A). The RADU 1302 can include circuitry in support of spurious mitigation as described herein, although circuitry in support of spurious mitigation can reside in other elements of transmit circuitry 315 or receive circuitry 320. The architecture 1300 also includes transmission circuitry 1301 and inner receiver circuitry 1303.

The signal processing block 1304 performs OFDM signal processing to translate communication from the baseband to an RF signal. The signal processing block 1304 can include hardware circuitry such as FFT hardware, buffers, caches, and other memory, and control plane support. The RX output 1306 can be used to determine the spectral distribution of the spurious interference by, for example, spurious agent circuitry 1308. The spurious agent circuitry 1308 also takes as inputs RX configuration information 1310, TX configuration information 1312, and any available sensing of the spurious level detected in the RX output 1306. RX configuration information 1310 and TX configuration information 1312 can include parameters such as number of antennas, mode (e.g., LTE), MIMO streams, frequencies, modulation scheme, etc., under which the wireless communication device is receiving and transmitting. The spurious agent circuitry 1308 can control the use of dedicated hardware (not shown in FIG. 13) to detect spurious interference as well as the allocation of mitigation hardware such as by providing or encoding a spur cancellation signal to cancel unmodulated spurs.

A spurious database 1314 can be initialized with parameters (amplitude coefficients of spurs, spur frequencies, etc.) or other information regarding known issues, known interference sources, etc., accumulated by the spurious agent circuitry 1308 under laboratory conditions during development of the wireless communication circuitry (for example, any of the elements show in FIGS. 3A, 3B, 3C, 3D, and 3E). The spurious database 1314 can be updatable by the spurious agent circuitry 1308, or remotely, based on the observed performance of such circuitry. Information retrieved from the spurious database 1314 can be used by other elements of FIG. 13 (e.g., the RADU 1302 and spurious agent circuitry 1308) to allocate hardware resources referred to as spur cancellers or spur canceller circuitry to perform spur mitigation, in response to changes of spurious levels driven by the changes in the electromagnetic environment of a multi-antenna system. Examples of spur canceller circuitry can include oscillators, phase comparators, equalizers, comparators, and other circuitry for providing a signal and for matching that signal to phase, amplitude, and frequency of spurious signals. The spurious database 1314 could also be updated using a cloud-based approach or based on information from any other remote device, core network element, base station, etc.

The spurious agent circuitry 1308 can inspect output of the signal processing circuitry 1304 (for example, FFT outputs) to determine where (e.g., in which OFDM symbols) anomalous signals have been detected. The spurious agent circuitry 1308 can prioritize these anomalous signals for mitigation, based on severity, amplitude, or other criteria. The spurious agent circuitry 1308 can acquire information regarding tone amplitude, frequency, phase, and other parameters of the anomalous signals and store such information in the spurious database 1314. The information can be time stamped, for example, or other identifying information can be stored in some aspects. The spurious agent can apply filters (e.g., Costas filters although aspects are not limited thereto) to the IQ data stream output by the signal processing circuitry 1304 to acquire this information. Spur cancellation resources can be applied by the spurious agent 1308 based on periodic or adhoc searches of the spurious database 1314 or based on pushes (periodic or otherwise) by the spurious database 1314.

The spur cancellation resources can be in the frequency domain or time domain. Indexing, pruning, or other database maintenance can be applied to the spurious database 1314 by the spurious agent 1308 or by a remote device, or database management software or service. The spurious agent 1308 can predict spurious database 1314 entries that will be applicable under certain conditions by deriving rules or through machine learning.

The spurious agent 1308 can also store the rules in the spurious database 1314. The spurious agent 1308 can generate rules expressed as a set of coefficients, wherein the coefficients describe integer multiples of frequencies that, added together, fall onto a harmonic of the victim frequency. For example, a CW spur can include the combination of two other frequencies that fall onto a harmonic of the victim frequency to create an impairment. A rule for such a CW spur would include coefficients (integer coefficients in some aspects, although aspects are not limited thereto) for the two other frequencies, such that when added together, add up to a harmonic of the victim frequency. Thus, the rule would mathematically describe how the CW spur (or other spurious agent) is generated.

In some aspects, elements of architecture 1300 can be used to mitigate and detect in-device interference. For example, the architecture 1300 can be used to detect spurs caused by elements of the wireless communication circuitry (for example, any of the elements shown in FIGS. 3A, 3B, 3C, 3D, and 3E) when the wireless communication is transmitting and receiving at the same time, leading to a degradation in the received signal. The signal processing circuitry 1304 output 1306 can be evaluated based upon knowledge of the TX configuration of the wireless communication circuitry. From the TX configuration and from rules regarding self-interference retrieved from the spurious database 1314, the spurious agent 1308 can determine the most likely source of RX impairments (e.g., LOs in the transmitter, crystals, digital circuits, etc.) to obviate the need for continuous monitoring of incoming signals for spurs or other interference. The spurious agent 1308 can use a correlator module to estimate the energy associated with different impairments, and use the result of the correlator to make decisions about what kernel types to use and how many kernel types to use for mitigation, wherein kernels are nonlinear terms for representing nonlinear components of an impairment. The spurious agent 1308 can also use the result of the correlator to allocate filter taps, to determine which impairments to prioritize, and to make other decisions.

Aspects for Phase Noise Reduction

As mentioned earlier herein, throughput can be increased by increasing RF signal bandwidth and modulation order. However, enhanced signal-to-noise ratio (SNR) and error vector magnitude (EVM) targets need to be met to maintain quality of reception at these higher bandwidths and modulation orders. RF phase locked loops (PLLs) according to aspects can be used to reduce phase noise to meet enhanced SNR and EVM targets. Aspects provide systems and methods that balance power dissipation and area parameters to equalize the PLL phase noise to minimize the phase noise contribution to overall EVM budget. Aspects can reduce factory calibration time for devices and can allow for measurement of PLL phase noise without usage of external equipment.

All digital PLLs (ADPLLs) can be used to minimize phase noise contribution. ADPLLs replace passive loop filter elements with a digital low pass filter (DLF). ADPLLs provide the flexibility of changing loop filter bandwidth to reduce or affect phase noise. ADPLLs also replace charge pump phase frequency detectors (PFDs) with time-to-digital converters (TDCs). On-chip PLL phase noise should be measured to determine how to vary DLF parameters (e.g., filter coefficients) and other ADPLL parameters to optimize phase noise. However, such measurements can be difficult to achieve because of limitations on chip outputs and the need for external equipment. Additionally, it may be difficult to simultaneously optimize phase noise and reduce fractional spurs, which in turn complicates factory calibration time of the ADPLL. Systems and methods according to aspects can be used to simultaneously optimize phase noise and reduce fractional spurs. Systems and methods according to aspects can perform on-chip phase noise measurement and spur estimation while using minimal or no external measurement equipment. Algorithms provided in systems according to aspects can derive filter coefficients to optimize phase noise.

Figure 14A:
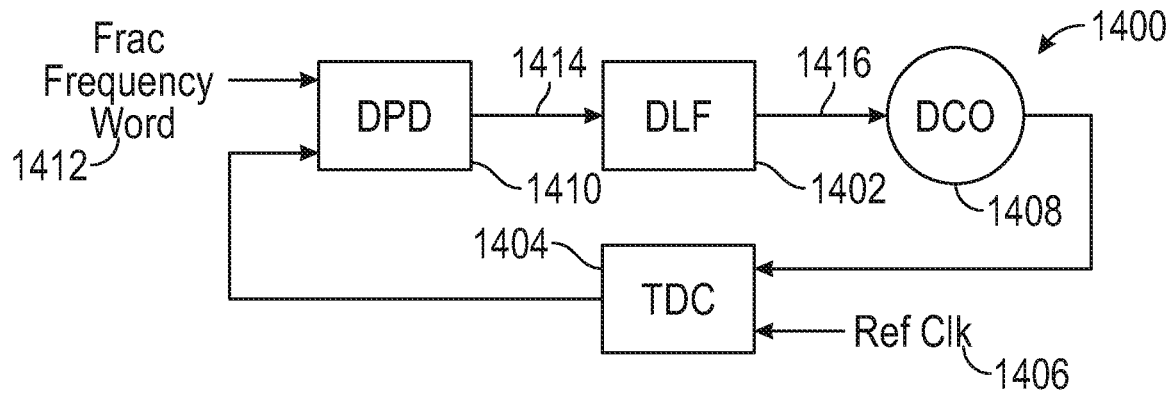
FIG. 14A illustrates an all-digital phase locked loop (ADPLL), according to some aspects.
Figure 14B:
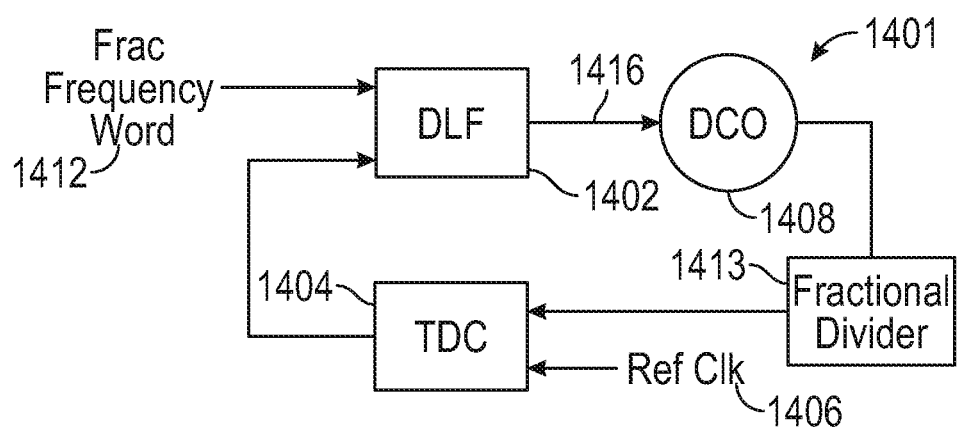
FIG. 14B illustrates an alternative all-digital phase locked loop (ADPLL), according to some aspects.

FIG. 14A illustrates an all-digital phase locked loop (ADPLL) 1400, according to some aspects, and FIG. 14B illustrates an alternative ADPLL 1401 according to some aspects. As mentioned earlier herein, the ADPLL 1400 (or 1401) replaces passive loop filter elements with DLF 1402. The ADPLL 1400 also replaces the charge pump PFD with a TDC 1404. The TDC 1404 compares the phase of a reference clock 1406 with the phase of a digitally-controlled oscillator (DCO) 1408 and generates a digital representation of the fractional phase difference between the reference clock 1406 and the DCO 1408. In ADPLL 1400 (also referred to as a dividerless ADPLL), a digital phase detector (DPD) 1410 subtracts this phase difference from a previously provided (e.g., programmed) fractional phase difference 1412 to generate an error signal 1414. DPD 1410 is not used in ADPLL 1401, however, ADPLL 1401 includes a fractional divider 1413 as seen in FIG. 14B. The DLF 1402 filters the error signal 1414 to produce output 1416 to control circuit elements (e.g., varactors, switch capacitors, etc., not shown in FIG. 14A or 14B) to change the DCO 1408 frequency. A negative feedback PLL loop then attempts to minimize the error signal 1414 thereby locking DCO 1408 phase to the reference phase.

Figure 15:
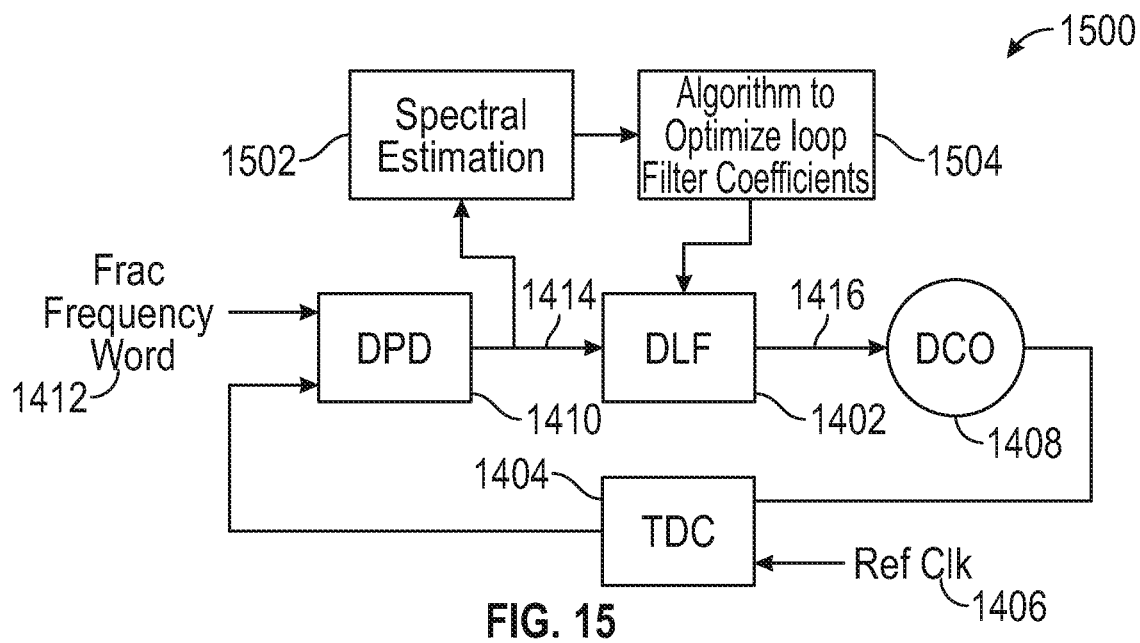
FIG. 15 illustrates an architecture for estimation and optimization of phase noise, according to some aspects.

FIG. 15 illustrates an architecture 1500 for estimation and optimization of phase noise, according to some aspects. Elements of the architecture 1500 that are similar to elements of the ADPLL 1400, 1401 (FIGS. 14A, 14B) are referred to using the same reference numeral as in FIGS. 14A and 14B. Spectral estimation circuitry 1502 generates a spectral estimation (using FFT or other technique) of the error signal 1414 to determine phase noise of the ADPLL 1400, 1401. Processing circuitry 1504 can then execute algorithms to generate filter coefficients for filter 1402 in order to change the output of the DLF 1402. The filter coefficients can be generated using an algorithm such as least mean squares (LMS) or other adaptive filter algorithms. The DLF 1402 produces output 1416 according to the provided filter coefficients to control circuit elements to change the DCO 1408 frequency. A negative feedback PLL loop will continue to execute to minimize the error signal 1414 until phase noise is below a predetermined threshold.

Figure 16:
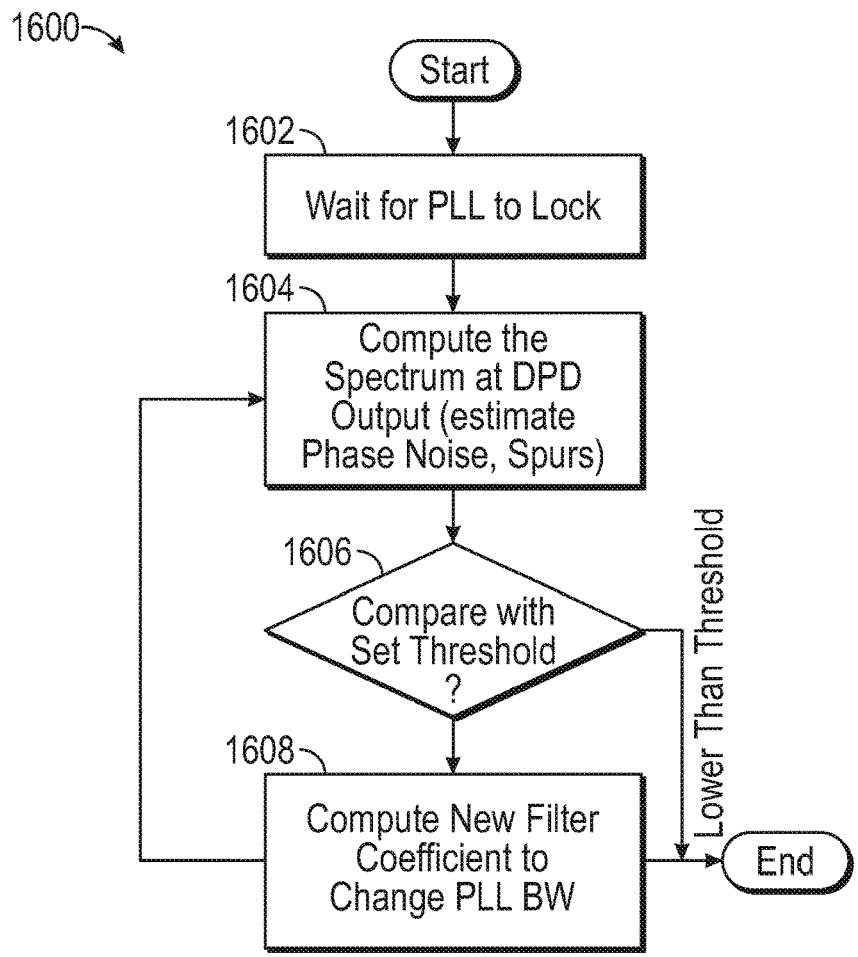
FIG. 16 illustrates a flow diagram of an example method for estimating and optimizing PLL phase noise and spurs, according to some aspects.

FIG. 16 illustrates a flow diagram of an example method 1600 for estimating and optimizing PLL phase noise and spurs, according to some aspects. At least some operations of method 1600 can be performed by elements of the architecture 1500 (FIG. 15) and reference is made to those elements where appropriate.

The example method 1600 can begin with operation 1602 with the PLL becoming locked. At operation 1604, spectral estimation circuitry 1502 generates a spectral estimation of error signal 1414. The spectral estimation circuitry can generate the spectral estimation using, for example, a FFT. The results of the spectral estimation can then be compared to previously-defined thresholds at operation 1606. The threshold units, criteria, etc., can vary depending on whether phase noise or fractional spurs are being estimated. More than one threshold can be used for different conditions. For example, different thresholds can apply for different channels of operation of the corresponding wireless communication device. If the results of the spectral estimation are above the threshold, then the processing circuitry 1604 will change filter coefficients of the DLF 1402 to change the DCO 1408 frequency.

The example method 1600 can be executed at different times upon detection of changes in conditions (e.g., in temperature), or upon power-up of an associated wireless communication device, among other situations and conditions, in addition to during factory calibration. The example method 1600 can also be used to minimize spurs being output by the ADPLL 1400, 1401. For example, if spurs have been detected when the wireless communication device is operating on a particular frequency, then the processing circuitry 1504 can change filter coefficients of the DLF 1402 to reduce amplitude of the spur or eliminate the spur completely.

Aspects, for Distortion Cancellation

With the introduction of full-duplex radios, de-sensitization and degradation of receiver dynamic range can occur due to TX driven second order intermodulation distortion (IMD2). Intermodulation distortion (IM) occurs when signals, including sinusoidal signals or signals other than single pure sinusoids, are applied to a nonlinear system. This can cause outputs other than harmonics of the input frequencies. By way of illustration, an input signal x(t) comprised of two sinusoids can be written as:

$$x(t) = A_1 \cos(\omega_1 t) + A_2 \cos(\omega_2 t) \tag{6},$$

where $A_1$ and $A_2$ are amplitudes and $\omega_1$ and $\omega_2$ are frequencies of respective sinusoidal component. Assuming up to second-order nonlinearities, the output y(t) of a nonlinear system can be written as:

$$y(t) = \alpha_0 + \alpha_1[A_1 \cos(\omega_1 t) + A_2 \cos(\omega_2 t)] + \alpha_2[A_1 \cos(\omega_1 t) + A_2 \cos(\omega_2 t)]^2 \tag{7},$$

where $\alpha_0$, $\alpha_1$ and $\alpha_2$ are constant coefficients. Equation (7) contains the following intermodulation product, which is referred to hereinafter as IMD2:

$$\alpha_2 A_1 A_2 \cos[(\omega_1 + \omega_2)t] + \alpha_2 A_1 A_2 \cos[(\omega_1 - \omega_2)t] \tag{8}$$

IMD2 can result from circuit nonlinearities combined with hardware layout asymmetries and device parameter mismatches caused by fabrication process variations. Because device mismatches may be unpredictable and random, the amount of IMD2 is itself random. Methods for resolving IMD2 have focused on post-production corrections such as calibration. However, such corrections are sensitive to changes in operating conditions, such as temperature and frequency.

Baseband IMD2 has two components: 1.) the second order non-linearity characteristic of any single branch of a balanced circuit, and 2.) the degree of imbalance between the branches of the circuit. IMD2 products appear as a DC common mode signal and the second order intercept point (IIP2) is determined by the combination of the strength of the common mode non-linearity plus the Common Mode Rejection Ratio (CMRR) of the circuit, where IIP2 is a metric of second-order intermodulation distortion performance of a system and an important consideration in RF filter design. Rather than providing circuits that eliminate IMD2 products (e.g., the first IMD2 component described above), methods and systems according to various aspects described herein can be used to minimize the degree of imbalance (e.g., the second IMD2 component described above). Methods and systems according to various aspects described herein can be used to cancel IMD2 products by applying an equalizer to the common mode signal and subtracting the result from the differential signal, wherein it is observed that the common mode signal is essentially identical to the IMD2 when the common mode signal is measured in each branch of the circuit.

Figure 17:
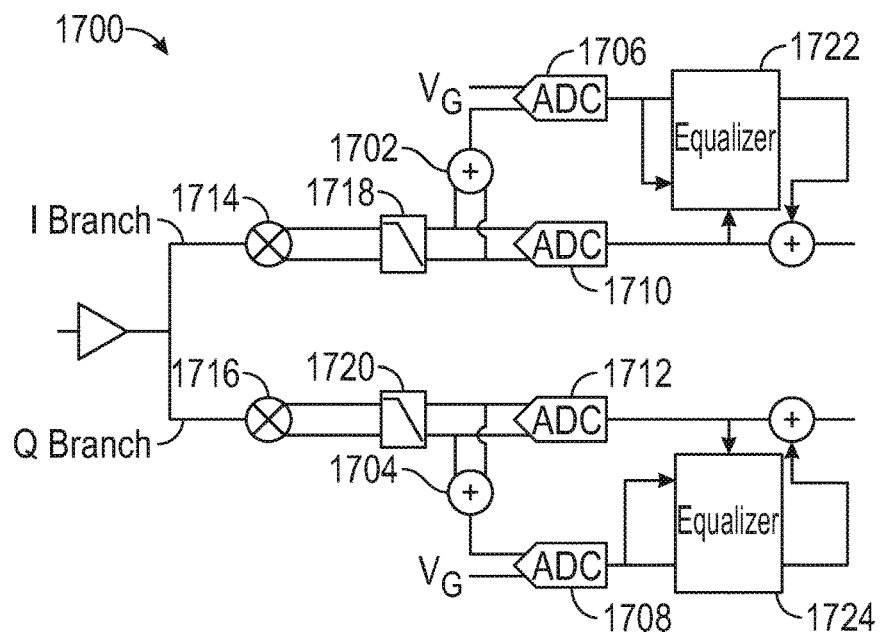
FIG. 17 illustrates a system for second order intermodulation distortion (IMD2) cancellation, according to some aspects.

FIG. 17 illustrates a system 1700 for IMD2 cancellation, according to some aspects. Elements of system 1700 can be included in receiver elements (for example, elements of FIG. 3E). In aspects, the system 1700 includes measurement circuitry and methods to measure the common mode signal (equated to the IMD2) at the baseband section of the receiver (e.g., receiver elements included in FIG. 3E) in each branch (e.g., in-phase (I) branch and quadrature (Q) branch) of the system, because each branch can have different IMD2 that is corrected for independently. Aspects further provide equalizer circuitry to estimate IMD2 impairment prior to subtracting the IMD2 impairment from the received signal. The IMD2 in any single branch of a circuit will be considerable larger than the overall IMD2 of the circuit because the IMD2 in any single branch of the circuit is not suppressed by how balanced the circuit is. In some use cases, the IMD2 term will be 30-40 dB higher in a single branch than in the overall circuit and will therefore be simpler to measure using the methods and systems of various aspects. In contrast, some other systems measure a differential signal, which can be very small and difficult to measure, and then attempt to balance the corresponding circuit based on this difficult measurement.

The common mode signal can be detected at the input 1702, 1704 to a circuit element, for example at the common mode detecting ADC 1706, 1708. Other circuit elements capable of quantizing a signal can be used besides the ADC 1706, 1708. The detection can be performed by, for example, measuring the common mode signal passively at the midpoint of a pair of resistors (not shown in FIG. 17) or by utilizing the common mode feedback from one of the circuit blocks. The common mode signal can also be estimated within the common mode detecting ADC 1706, 1708. It is assumed that IMD2 generation happens before the RX ADC 1710, 1712. For example, IMD2 may be introduced at an interface between the mixer 1714, 1716 and the analog baseband. Each branch (e.g., I branch and Q branch) can also include element 1718, 1720, which can include a low pass filter, amplifier, or other combination of elements to give attenuation to reduce requirements on the RX ADC 1710, 1712. The common mode signal (equivalent to the IMD2 as described above) can be about 30 dB up from the noise floor of the receiver. The desired received signal is suppressed by the same amount as the IMD2 when measured differentially at each branch (e.g., I branch and Q branch). Accordingly, the signal seen at the common detecting ADC 1706, 1708 is the IMD2 signal.

The common mode detecting ADC 1706, 1708 can have substantially lower requirements than the RX ADC 1710, 1712 (e.g., within a range of about 10-20 dB lower in some aspects), suggesting that the common mode detecting ADC 1706, 1708 should occupy a reduced area and draw significantly less current than the RX ADC 1710, 1712. In one aspect, the common mode detecting ADC 1706, 1708 plus a DAC or pair of DACs (not shown in FIG. 17) could replace the common mode feedback circuitry. The common mode detecting ADC 1706, 1708 can inherently be single ended and therefore the common mode detecting ADC 1706, 1708 is inherently non-differential. Accordingly, the common mode detecting ADC 1706, 1708 is shown as a differential ADC with one input driven by a ground voltage Vo which will be a voltage, typically non-zero and between the rails (e.g., 2.5 V in a 0-5 V system).

The equalizer 1722, 1724 matches the gain and amplitude of the measured IMD2 signal to its contribution to the RX signal. The equalizer 1722, 1724 can include a digital finite impulse response (FIR) filter with sufficient number of taps to accommodate both the expected delay variation between the estimated and actual IMD2 as well as any frequency variation introduced by the mixer amplifier or by the RX ADC 1706, 1708. Any type of adaptive algorithm could be used, for example LMS or a variant thereof can be used in some aspects. The equalizer 1722, 1724 can adjust the gain and timing delay of the actual IMD2 relative to the actual receive signal, and mitigate the frequency dependence introduced by other elements of system 1700. The output of equalizer 1722, 1724 (e.g., the equalizer output) is then subtracted from the output of RX ADC 1710, 1712 to provide receiver output from which IMD2 components have been removed.

Figure 18:
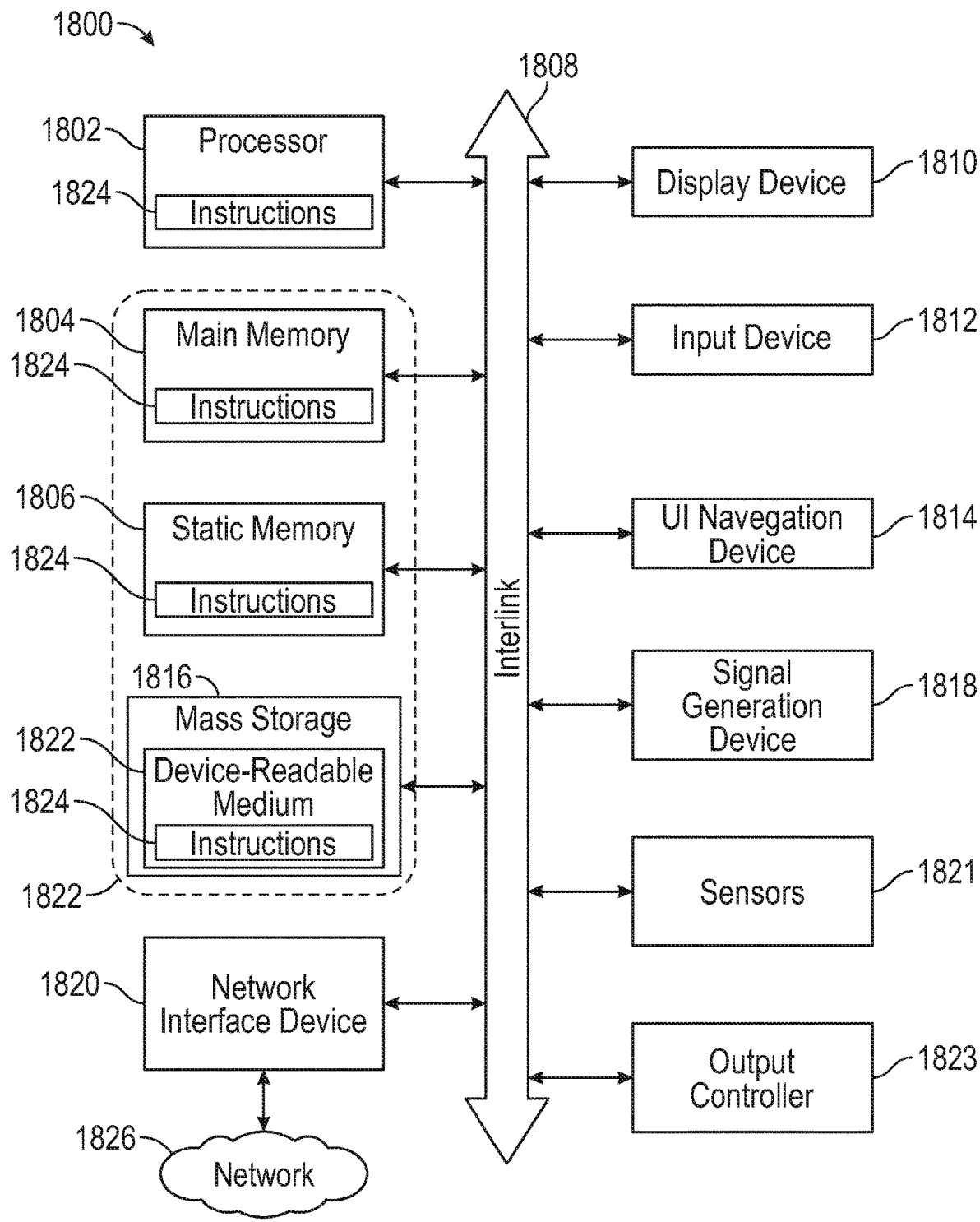
FIG. 18 illustrates a block diagram of a communication device such as an evolved Node-B (eNB), a new generation Node-B (gNB), an access point (AP), a wireless station (STA), a mobile station (MS), or a user equipment (UE), in accordance with some aspects.

FIG. 18 illustrates a block diagram of a communication device 1800 such as an evolved Node-B (eNB), a new generation Node-B (gNB), an access point (AP), a wireless station (STA), a mobile station (MS), or a user equipment (UE), in accordance with some aspects. In alternative aspects, the communication device 1800 may operate as a standalone device or may be connected (e.g., networked) to other communication devices. In some aspects, the communication device 1800 can use one or more of the techniques and circuits discussed herein, in connection with any of FIG. 1-FIG. 17.

Circuitry (e.g., processing circuitry) is a collection of circuits implemented in tangible entities of the device 1800 that include hardware (e.g., simple circuits, gates, logic, etc.). Circuitry membership may be flexible over time. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a machine readable medium physically modified (e.g., magnetically, electrically, moveable placement of invariant massed particles, etc.) to encode instructions of the specific operation.

In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine readable medium elements are part of the circuitry or are communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time. Additional examples of these components with respect to the device 1800 follow.

In some aspects, the device 1800 may operate as a standalone device or may be connected (e.g., networked) to other devices. In a networked deployment, the communication device 1800 may operate in the capacity of a server communication device, a client communication device, or both in server-client network environments. In an example, the communication device 1800 may act as a peer communication device in peer-to-peer (P2P) (or other distributed) network environment. The communication device 1800 may be a UE, eNB, PC, a tablet PC, a STB, a PDA, a mobile telephone, a smart phone, a web appliance, a network router, switch or bridge, or any communication device capable of executing instructions (sequential or otherwise) that specify actions to be taken by that communication device. Further, while only a single communication device is illustrated, the term "communication device" shall also be taken to include any collection of communication devices that individually or jointly execute a set (or multiple sets) of instructions to perform any one or more of the methodologies discussed herein, such as cloud computing, software as a service (SaaS), other computer cluster configurations.

Examples, as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a communication device-readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

Communication device (e.g., UE) 1800 may include a hardware processor 1802 (e.g., a central processing unit (CPU), a graphics processing unit (GPU), a hardware processor core, or any combination thereof), a main memory 1804, a static memory 1806, and mass storage 1816 (e.g., hard drive, tape drive, flash storage, or other block or storage devices), some or all of which may communicate with each other via an interlink (e.g., bus) 1808.

The communication device 1800 may further include a display unit 1810, an alphanumeric input device 1812 (e.g., a keyboard), and a user interface (UI) navigation device 1814 (e.g., a mouse). In an example, the display unit 1810, input device 1812 and UI navigation device 1814 may be a touch screen display. The communication device 1800 may additionally include a signal generation device 1818 (e.g., a speaker), a network interface device 1820, and one or more sensors 1821, such as a global positioning system (GPS) sensor, compass, accelerometer, or other sensor. The communication device 1800 may include an output controller 1828, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 1816 may include a communication device-readable medium 1822, on which is stored one or more sets of data structures or instructions 1824 (e.g., software) embodying or utilized by any one or more of the techniques or functions described herein. In some aspects, registers of the processor 1802, the main memory 1804, the static memory 1806, and/or the mass storage 1816 may be, or include (completely or at least partially), the device-readable medium 1822, on which is stored the one or more sets of data structures or instructions 1824, embodying or utilized by any one or more of the techniques or functions described herein. In an example, one or any combination of the hardware processor 1802, the main memory 1804, the static memory 1806, or the mass storage 1816 may constitute the device-readable medium 1822.

As used herein, the term "device-readable medium" is interchangeable with "computer-readable medium" or "machine-readable medium". While the communication device-readable medium 1822 is illustrated as a single medium, the term "communication device-readable medium" may include a single medium or multiple media (e.g., a centralized or distributed database, and/or associated caches and servers) configured to store the one or more instructions 1824.

The term "communication device-readable medium" may include any medium that is capable of storing, encoding, or carrying instructions for execution by the communication device 1800 and that cause the communication device 1800 to perform any one or more of the techniques of the present disclosure, or that is capable of storing, encoding or carrying data structures used by or associated with such instructions. Non-limiting communication device-readable medium examples may include solid-state memories, and optical and magnetic media. Specific examples of communication device-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks;

Random Access Memory (RAM); and CD-ROM and DVD-ROM disks. In some examples, communication device-readable media may include non-transitory communication device-readable media. In some examples, communication device-readable media may include communication device-readable media that is not a transitory propagating signal.

The instructions 1824 may further be transmitted or received over a communications network 1826 using a transmission medium via the network interface device 1820 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, a Long Term Evolution (LTE) family of standards, a Universal Mobile Telecommunications System (UMTS) family of standards, peer-to-peer (P2P) networks, among others. In an example, the network interface device 1820 may include one or more physical jacks (e.g., Ethernet, coaxial, or phone jacks) or one or more antennas to connect to the communications network 1826. In an example, the network interface device 1820 may include a plurality of antennas to wirelessly communicate using at least one of single-input multiple-output (SIMO), MIMO, or multiple-input single-output (MISO) techniques. In some examples, the network interface device 1820 may wirelessly communicate using Multiple User MIMO techniques.

The term "transmission medium" shall be taken to include any intangible medium that is capable of storing, encoding or carrying instructions for execution by the communication device 1800, and includes digital or analog communications signals or other intangible medium to facilitate communication of such software. In this regard, a transmission medium in the context of this disclosure is a device-readable medium.

Figure 19:
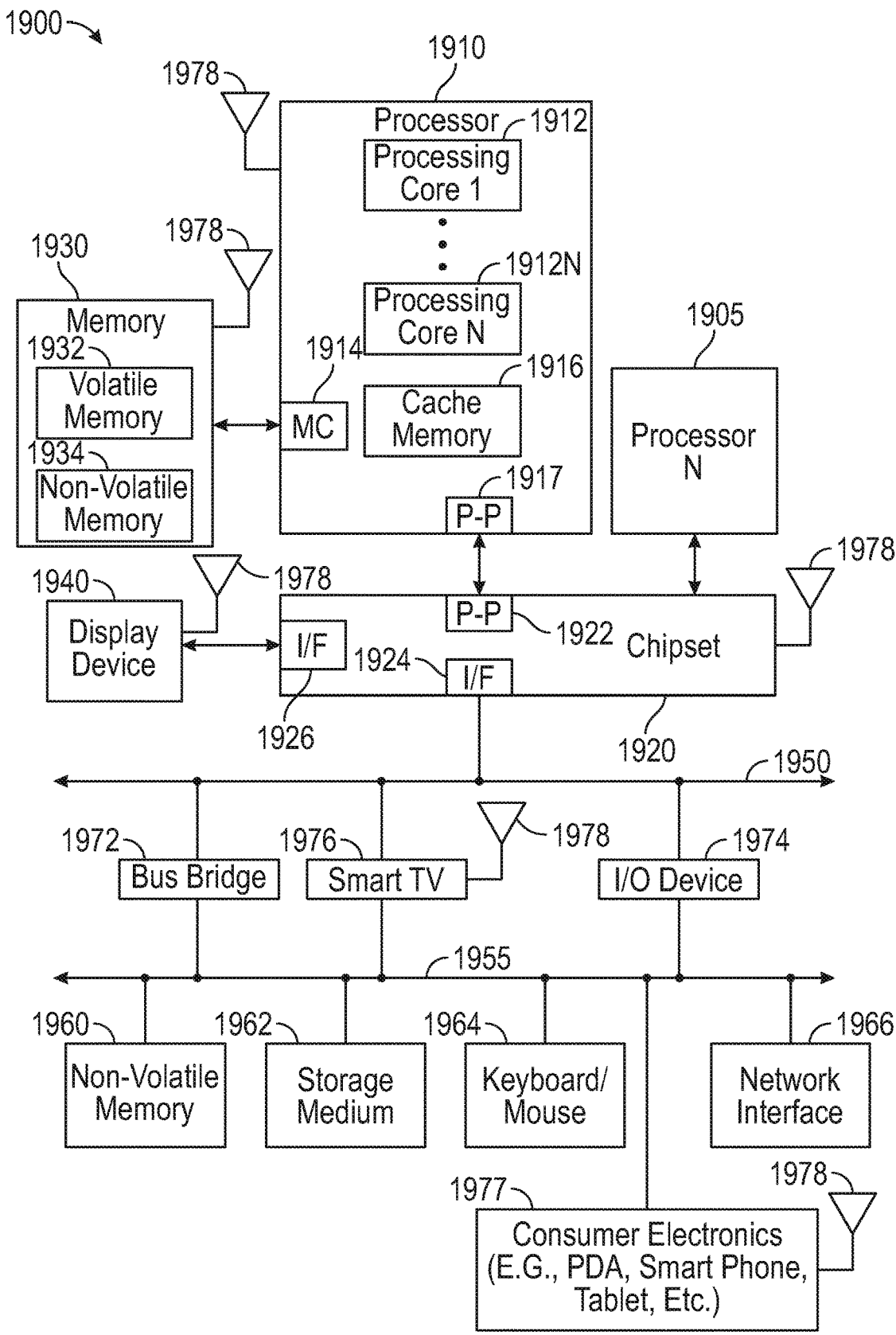
FIG. 19 illustrates a system level diagram, depicting an example of an electronic device (e.g., system) that can include, for example, a transmitter configured to selectively fan out a signal to one of multiple communication channels.

FIG. 19 illustrates a system level diagram, depicting an example of an electronic device (e.g., system) that can include, for example, a transmitter configured to selectively fan out a signal to one of multiple communication channels. FIG. 19 is included to show an example of a higher-level device application for the subject matter discussed above with regards to FIGS. 1-17. In one aspect, system 1900 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some aspects, system 1900 is a system on a chip (SOC) system.

In one aspect, processor 1910 has one or more processor cores 1912, . . . , 1912N, where 1912N represents the Nth processor core inside processor 1910 where N is a positive integer. In one aspect, system 1900 includes multiple processors including 1910 and 1905, where processor 1905 has logic similar or identical to the logic of processor 1910. In some aspects, processing core 1912 includes, but is not limited to, pre-fetch logic to fetch instructions, decode logic to decode the instructions, execution logic to execute instructions and the like. In some aspects, processor 1910 has a cache memory 1916 to cache instructions and/or data for system 1900. Cache memory 1916 may be organized into a hierarchal structure including one or more levels of cache memory.

In some aspects, processor 1910 includes a memory controller 1914, which is operable to perform functions that enable the processor 1910 to access and communicate with memory 1930 that includes a volatile memory 1932 and/or a non-volatile memory 1934. In some aspects, processor 1910 is coupled with memory 1930 and chipset 1920. Processor 1910 may also be coupled to a wireless antenna 1978 to communicate with any device configured to transmit and/or receive wireless signals. In one aspect, an interface for wireless antenna 1978 operates in accordance with, but is not limited to, the IEEE 802.11 standard and its related family, Home Plug AV (HPAV), Ultra Wide Band (UWB), Bluetooth, WiMax, or any form of wireless communication protocol.

In some aspects, volatile memory 1932 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 1934 includes, but is not limited to, flash memory, phase change memory (PCM), read-only memory (ROM), electrically erasable programmable read-only memory (EEPROM), or any other type of non-volatile memory device.

Memory 1930 stores information and instructions to be executed by processor 1910. In one aspect, memory 1930 may also store temporary variables or other intermediate information while processor 1910 is executing instructions. In the illustrated aspect, chipset 1920 connects with processor 1910 via Point-to-Point (PtP or P-P) interfaces 1917 and 1922. Chipset 1920 enables processor 1910 to connect to other elements in system 1900. In some aspects of the example system, interfaces 1917 and 1922 operate in accordance with a PtP communication protocol such as the Intel® QuickPath Interconnect (QPI) or the like. In other aspects, a different interconnect may be used.

In some aspects, chipset 1920 is operable to communicate with processor 1910, 1905N, display device 1940, and other devices, including a bus bridge 1972, a smart TV 1976, I/O devices 1974, nonvolatile memory 1960, a storage medium (such as one or more mass storage devices) 1962, a keyboard/mouse 1964, a network interface 1966, and various forms of consumer electronics 1977 (such as a PDA, smart phone, tablet etc.), etc. In one aspect, chipset 1920 couples with these devices through an interface 1924. Chipset 1920 may also be coupled to a wireless antenna 1978 to communicate with any device configured to transmit and/or receive wireless signals.

Chipset 1920 connects to display device 1940 via interface 1926. Display 1940 may be, for example, a liquid crystal display (LCD), a plasma display, cathode ray tube (CRT) display, or any other form of visual display device. In some aspects of the example system, processor 1910 and chipset 1920 are merged into a single SOC. In addition, chipset 1920 connects to one or more buses 1950 and 1955 that interconnect various system elements, such as I/O devices 1974, nonvolatile memory 1960, storage medium 1962, a keyboard/mouse 1964, and network interface 1966. Buses 1950 and 1955 may be interconnected together via a bus bridge 1972.

In one aspect, mass storage device 1962 includes, but is not limited to, a solid-state drive, a hard disk drive, a universal serial bus flash memory drive, or any other form of computer data storage medium. In one aspect, network interface 1966 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one aspect, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 19 are depicted as separate blocks within the system 1900, the functions performed by some of these blocks may be integrated within a single semiconductor circuit or may be implemented using two or more separate integrated circuits. For example, although cache memory 1916 is depicted as a separate block within processor 1910, cache memory 1916 (or selected aspects of 1916) can be incorporated into processor core 1912.

ADDITIONAL NOTES AND ASPECTS

Example 1 is a wireless communication device, comprising: an antenna configured to receive a radio frequency (RF) signal; signal estimation circuitry configured to generate estimates of amplitude and frequency for unmodulated spurs within the RF signal; multi-tone generator circuitry coupled to the signal estimation circuitry and configured to generate a composite spur cancellation signal based on the estimates of amplitude and frequency for unmodulated spurs within the RF signal; and adder circuitry configured to subtract the spur cancellation signal from the RF signal to generate a spur cancelled signal.

In Example 2, the subject matter of Example 1 includes wherein the multi-tone generator circuitry includes processing circuitry configured to calculate the composite spur cancellation signal over a period, the period based on a period of a fundamental spur signal within the RF signal.

In Example 3, the subject matter of Example 2 includes wherein the processing circuitry is configured to store parameters of the composite spur cancellation signal in a look-up table.

In Example 4, the subject matter of any of Examples 1-3 includes wherein the frequencies of each of the unmodulated spurs are integer multiples of the frequency of the fundamental spur signal.

In Example 5, the subject matter of any of Examples 1-4 includes wherein the multi-tone generator circuitry includes a resampler to resample the output to a frequency to match a sampling rate of downstream baseband circuitry.

In Example 6, the subject matter of any of Examples 1-5 includes wherein the multi-tone generator circuitry includes processing circuitry configured to calculate the composite spur cancellation signal using an inverse Fourier transform.

In Example 7, the subject matter of Example 6 includes wherein the frequencies of the unmodulated spurs are non-integer multiples of the frequency of a fundamental spur signal within the RF signal.

Example 8 is a wireless communication device, comprising: an antenna configured to sense a radio frequency (RF) signal; and spurious agent circuitry configured to search the RF signal for an unmodulated spur having a severity level above a threshold; extract a rule to describe the unmodulated spur; and encode a spur canceller signal to cancel the unmodulated spur based on the rule.

In Example 9, the subject matter of Example 8 includes wherein the spur canceller signal is in the time domain.

In Example 10, the subject matter of Example 8 includes wherein the spur canceller signal is in the frequency domain.

In Example 11, the subject matter of any of Examples 8-10 includes a database to store parameters of the unmodulated spur.

In Example 12, the subject matter of Example 11 includes wherein the parameters of the unmodulated spur include at least one of tone amplitude, frequency, and phase.

In Example 13, the subject matter of any of Examples 11-12 includes wherein the database is further configured to store information regarding known interference sources.

In Example 14, the subject matter of any of Examples 8-13 includes wherein the spurious agent circuitry is further configured to receive, as an input, transmission configuration information that includes parameters under which the wireless communication device is transmitting.

In Example 15 the subject matter of Example 14 includes wherein the transmission (TX) configuration information includes an indication of the number of antennas being used for transmission.

In Example 16, the subject matter of any of Examples 8-15 includes wherein the spurious agent circuitry is further configured to receive, as an input, receive (RX) configuration information that includes parameters under which the wireless communication device is receiving.

In Example 17, the subject matter of any of Examples 8-16 includes wherein the spurious agent circuitry is further configured to detect spurs caused by in-device interference.

In Example 18, the subject matter of any of Examples 8-17 includes wherein the in-device interference is generated by a TX element.

Example 19 is a method for estimating phase locked loop (PLL) noise, the method comprising: generating, at an output of a digital phase detector of the PLL, an estimate of an error signal output by the PLL; comparing the estimate to a threshold error value to determine, at processing circuitry of the PLL, whether to change a parameter of operation of the PLL; and changing a parameter of operation of the PLL based on the comparing.

In Example 20, the subject matter of Example 19 includes wherein the generating includes generating a spectral estimation of the error signal using Fast Fourier Transform (FFT).

In Example 21, the subject matter of any of Examples 19-20 includes wherein the threshold error value is based on whether the error signal includes phase noise or fractional spurs.

In Example 22, the subject matter of any of Examples 19-21 includes wherein the threshold error value varies based on channel operating conditions.

In Example 23, the subject matter of any of Examples 19-22 includes wherein the method is executed upon powering up the PLL.

In Example 24, the subject matter of any of Examples 19-23 includes wherein the parameter of operation of the PLL includes filter bandwidth for a filter of the PLL.

In Example 25, the subject matter of any of Examples 19-24 includes wherein the parameter of operation of the PLL includes oscillator frequency of an oscillator of the PLL.

Example 26 is a wireless communication device, comprising: measurement circuitry to measure a common mode signal at both of an in-phase (I) branch and a quadrature (Q) branch of a receiver of the wireless communication device to generate a common mode signal measurement for each of the I branch and the Q branch; equalizer circuitry, at each of the I branch and the Q branch, to estimate distortion based on the common mode signal measurement to generate an equalizer output for each of the I branch and the Q branch; and circuitry to subtract the equalizer output from a desired signal of the corresponding I branch or Q branch.

In Example 27, the subject matter of Example 26 includes wherein the measurement circuitry is an input of a quantizing circuit element.

In Example 28, the subject matter of Example 27 includes wherein the quantizing circuit element is a differential analog-to-digital converter (ADC).

In Example 29, the subject matter of any of Examples 27-28 includes wherein the measurement circuitry includes passive circuit elements.

In Example 30, the subject matter of Example 27 includes wherein the measurement circuitry includes active circuit elements.

In Example 31, the subject matter of any of Examples 26-30 includes wherein the equalizer circuitry includes a finite impulse response (FIR) filter.

In Example 32, the subject matter of Example 31 includes wherein the FIR filter includes a number of taps based upon an expected delay variation between the estimated and actual distortion.

In Example 33, the subject matter of any of Examples 26-32 includes wherein the distortion includes second order intermodulation distortion (IMD2).

Example 34 is at least one machine-readable medium including instructions that, when executed by processing circuitry, cause the processing circuitry to perform operations to implement of any of Examples 1-33.

Example 35 is an apparatus comprising means to implement of any of Examples 1-34.

Example 36 is a system to implement of any of Examples 1-33.

The above detailed description includes references to the accompanying drawings, which form a part of the detailed description. The drawings show, by way of illustration, specific aspects in which the invention can be practiced. These aspects are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other aspects can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed aspect. Thus, the following claims are hereby incorporated into the Detailed Description, with each claim standing on its own as a separate aspect, and it is contemplated that such aspects can be combined with each other in various combinations or permutations. The scope of the invention should be determined with reference to the appended claims, along with the full scope of equivalents to which such claims are legally entitled.

What is claimed is:

1. A wireless communication device, comprising:
   an antenna configured to detect a radio frequency (RF) signal;
   signal estimation circuitry configured to receive the RF signal and generate estimates of amplitude and frequency for unmodulated spurs within the RF signal;
   multi-tone generator circuitry coupled to the signal estimation circuitry and configured to generate a composite spur cancellation signal based on the estimates of amplitude and frequency for unmodulated spurs within the RF signal; and
   adder circuitry configured to subtract the composite spur cancellation signal from the RF signal to generate a spur cancelled signal,
   wherein for unmodulated spurs that are non-integer multiples of a fundamental spur frequency, the multi-tone generator circuitry is configured to generate the composite spur cancellation signal comprising multiple tones based on performance of an inverse Fast Fourier transform (IFFT) on the estimates of amplitude and frequency.

2. The wireless communication device of claim 1, wherein the multi-tone generator circuitry includes processing circuitry, and
   wherein for unmodulated spurs that are integer multiples of a fundamental spur frequency, the processing circuitry is configured to calculate the composite spur cancellation signal over a period, the period based on a period of a fundamental spur signal within the RF signal.

3. The wireless communication device of claim 2, wherein for unmodulated spurs that are integer multiples of a fundamental spur frequency, the processing circuitry is configured to store parameters of the composite spur cancellation signal in a look-up table.

4. The wireless communication device of claim 1, wherein the multi-tone generator circuitry includes a resampler to resample the composite spur cancellation signal to a higher frequency to match a sampling rate of a downstream baseband circuitry.

5. A wireless communication device, comprising:
   an antenna configured to detect a radio frequency (RF) signal; and spurious agent circuitry configured to:
search the RF signal for an unmodulated spur having a severity level above a threshold;
extract a rule to describe the unmodulated spur; and
encode a spur canceller signal to cancel the unmodulated spur based on the rule.

6. The wireless communication device of claim 5, wherein the spur canceller signal is in the time domain.

7. The wireless communication device of claim 5, wherein the spur canceller signal is in the frequency domain.

8. The wireless communication device of claim 5, further comprising a database to store parameters of the unmodulated spur, wherein the parameters of the unmodulated spur include at least one of tone amplitude, frequency, and phase, and wherein the database is further configured to store information of known interference sources.

9. The wireless communication device of claim 5, wherein the spurious agent circuitry is further configured to receive, as an input, transmission configuration information that includes parameters under which the wireless communication device is transmitting.

10. The wireless communication device of claim 9, wherein the transmission (TX) configuration information includes an indication of the number of antennas used for transmission.

11. The wireless communication device of claim 5, wherein the spurious agent circuitry is further configured to receive, as an input, receive (RX) configuration information that includes parameters under which the wireless communication device is receiving.

* * * * *